(12) United States Patent
Jain

(10) Patent No.: US 11,830,815 B2
(45) Date of Patent: Nov. 28, 2023

(54) MICROELECTRONIC DEVICES INCLUDING STAIR STEP STRUCTURES, AND RELATED ELECTRONIC SYSTEMS AND METHODS

(71) Applicant: Micron Technology, Inc., Boise, ID (US)

(72) Inventor: Harsh Narendrakumar Jain, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 99 days.

(21) Appl. No.: 17/006,600

(22) Filed: Aug. 28, 2020

(65) Prior Publication Data

US 2022/0068827 A1 Mar. 3, 2022

(51) Int. Cl.
| | |
|---|---|
| *H01L 23/532* | (2006.01) |
| *H01L 21/768* | (2006.01) |
| *H01L 23/522* | (2006.01) |
| *H01L 23/528* | (2006.01) |
| *H10B 41/27* | (2023.01) |
| *H10B 41/35* | (2023.01) |
| *H10B 43/27* | (2023.01) |
| *H10B 43/35* | (2023.01) |

(52) U.S. Cl.
CPC .. *H01L 23/53295* (2013.01); *H01L 21/76831* (2013.01); *H01L 23/5226* (2013.01); *H01L 23/5283* (2013.01); *H10B 41/27* (2023.02); *H10B 41/35* (2023.02); *H10B 43/27* (2023.02); *H10B 43/35* (2023.02)

(58) Field of Classification Search
CPC ......... H01L 27/11582; H01L 27/11556; H01L 27/11575; H01L 27/11565; H01L 27/1157; H10B 43/27; H10B 41/27; H10B 43/10; H10B 43/50; H10B 43/35
See application file for complete search history.

(56) References Cited

U.S. PATENT DOCUMENTS

| | | | |
|---|---|---|---|
| 9,064,576 | B2 | 6/2015 | Tanzawa |
| 9,397,107 | B2 | 7/2016 | Makala et al. |
| 9,806,090 | B2 | 10/2017 | Sharangpani et al. |
| 9,941,209 | B2 | 4/2018 | Tessariol et al. |
| 10,014,309 | B2 | 7/2018 | Dorhout et al. |
| 10,141,330 | B1 | 11/2018 | Indsay et al. |
| 10,269,626 | B2 | 4/2019 | Ha et al. |
| 10,381,080 | B2 | 8/2019 | Pan et al. |
| 10,446,578 | B1 | 10/2019 | Howder et al. |

(Continued)

*Primary Examiner* — Tony Tran
(74) *Attorney, Agent, or Firm* — TraskBritt

(57) ABSTRACT

A microelectronic device comprises a first deck structure comprising alternating conductive structures and insulating structures arranged in tiers, each of the tiers individually comprising one of the conductive structures and one of the insulating structures, a second deck structure vertically overlying the first deck structure and comprising additional tiers of the conductive structures and insulative structures, a staircase structure within the first deck structure and having steps comprising edges of the tiers, a dielectric material covering the steps of the staircase structure and extending through the first deck structure, and a liner material interposed between the steps of the staircase structure and terminating at an interdeck region between the first deck structure and the second deck structure. Related microelectronic devices, electronic systems, and methods are also described.

16 Claims, 14 Drawing Sheets

(56) References Cited

U.S. PATENT DOCUMENTS 10,497,715 B2    12/2019  Kim et al.
2010/0013049 A1*  1/2010  Tanaka .............. H01L 27/11575
                                                      257/532
2020/0194447 A1*  6/2020  Sun ................... H01L 27/11529

* cited by examiner

MICROELECTRONIC DEVICES INCLUDING STAIR STEP STRUCTURES, AND RELATED ELECTRONIC SYSTEMS AND METHODS

TECHNICAL FIELD

The disclosure, in various embodiments, relates generally to the field of microelectronic device design and fabrication. More specifically, the disclosure relates to microelectronic devices, and related electronic systems and methods of forming the microelectronic devices.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in tiers of conductive structures (e.g., word lines) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., word lines) so that memory cells in the vertical memory array can be uniquely selected for writing, reading, or erasing operations. One method of forming such an electrical connection includes forming so-called at least one "staircase" (or "stair step") structure at edges (e.g., horizontal ends) of the tiers of conductive structures. The staircase structure includes individual "steps" providing contact regions of the conductive structures upon which conductive contact structures can be positioned to provide electrical access to the conductive structures.

As vertical memory array technology has advanced, additional memory density has been provided by forming vertical memory arrays to include additional tiers of conductive structures and, hence, additional staircase structures and/or additional steps in individual staircase structures associated therewith. However, increasing the quantity of tiers of conductive structures (and hence, the quantity of staircase structures and/or the quantity of steps in individual staircase structures) of a stack structure without undesirably increasing the overall width (e.g., lateral footprint) of the stack structure can result in undesirably complex and congested routing paths to electrically connect the conductive structures to additional components (e.g., string drivers) of the memory device. In some instances, as the height of the staircase structure increases, there is an increased risk that conductive contacts to the individual steps are not properly formed, leading to failure of the vertical memory array.

DETAILED DESCRIPTION

Figure 1A:
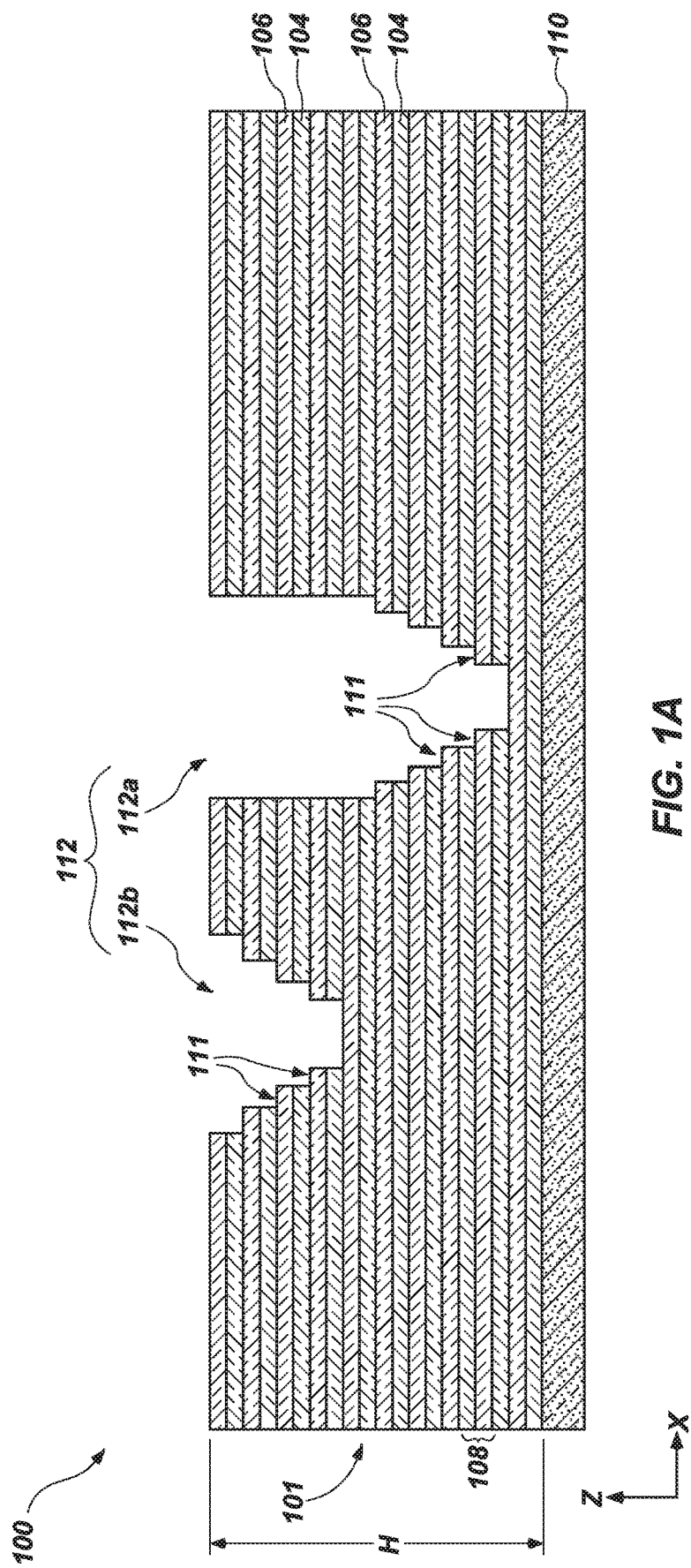
FIG. 1A through FIG. 1G are simplified cross-sectional views illustrating a method of forming a microelectronic device structure, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device structure or microelectronic device (e.g., a memory device, such as a 3D NAND Flash memory device) or a complete microelectronic device. The structures described below do not form a complete microelectronic device. Only those process acts and structures necessary to understand the embodiments described herein are described in detail below. Additional acts to form a complete microelectronic device from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

According to embodiments described herein, a method of forming a microelectronic device including a stair step region comprising tiers of vertically alternating conductive structures and insulative structures is described. Stair step structures are formed in a first deck structure comprising vertically alternating insulative structures and other insulative structures and a liner material is formed over the steps of the stair step structures of the first deck structure. In some embodiments, the liner material comprises a nitride material, such as silicon nitride. A dielectric material may be formed over the liner material and within the stair step structures of the first deck structure. A second deck structure may be formed over the first deck structure and additional stair step structures may be formed in the second deck structures. Openings may be formed within the second deck structure over the stair step structures of the first deck structure. A second liner material may be formed over the stair step structures of the second deck structure and within the openings of the second deck structure. Laterally extending portions of the second liner material may be removed from within the openings. After removing the laterally extending portions of the second liner material, a dielectric material may be formed within the openings and over the stair step structures of the first deck structure. The other insulative structures of the first deck structure and the second deck structure may be replaced with electrically conductive materials to form electrically conductive structures. Electrically conductive contact structures are formed through the dielectric material and in contact with the electrically conductive structures of the stair step structures in the first deck structure and the second deck structure.

Removal of the laterally extending portions of the second liner material prior to forming the dielectric material within the openings facilitates improved accuracy of placement of the electrically conductive contact structures on the electrically conductive structures of the first deck structure. By way of comparison, conventional microelectronic devices from which a second liner material is not removed may include laterally extending portions of a first liner material within stair step structures of a lower deck structure, and laterally extending portions of a second liner material within openings over the stair step structure of the lower deck structure. During formation of the electrically conductive contact structures to the electrically conductive structures of the stair step structures of the first deck structure, the second liner material may cause the electrically conductive contact structures of the first deck structure to be separated from the electrically conductive structures of the first deck structure due to the different etch rate of the second liner material relative to the dielectric material. In other words, the second liner material may result in underetching of the dielectric material and lead to improper placement (e.g., vertical placement) of the electrically conductive contact structures in the first deck structure.

In some embodiments, the microelectronic device may include a liner material on the steps of the stair step structures of the first deck structure and may not include the liner material on sides of the insulative structures and the electrically conductive structures of the second deck structure vertically overlying the stair step structures of the first deck structure. In other embodiments, the liner material on sides of the insulative structures and the electrically conductive structures of the second deck structure vertically overlying the stair step structures of the first deck structure may have a thickness less than a thickness of the liner material on the steps of the stair step structures of the first deck structure.

FIG. 1A through FIG. 1G illustrate a method of forming a microelectronic device structure 100, in accordance with embodiments of the disclosure. FIG. 1A is a simplified cross-sectional view of a microelectronic device structure 100 comprising a first deck structure 101 including a vertically alternating (e.g., in Z-direction) sequence of insulative structures 104 and other insulative structures 106 arranged in tiers 108.

The insulative structures 104 may each individually be formed of and include, for example, an insulative material, such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), and amorphous carbon. In some embodiments, the insulative structures 104 comprise silicon dioxide.

The other insulative structures 106 may be formed of and include an insulative material exhibiting an etch selectivity with respect to the insulative structures 104. The other insulative structures 106 may include, for example, a nitride material (e.g., silicon nitride ($Si_3N_4$)), an oxynitride material (e.g., silicon oxynitride). In some embodiments, the other insulative structures 106 comprise a nitride material, such as silicon nitride.

Although FIG. 1A illustrates a particular number of tiers 108 of the insulative structures 104 and the other insulative structures 106, the disclosure is not so limited. In some embodiments, the first deck structure 101 includes a desired quantity of tiers 108, such as sixty-four (64) tiers 108. In other embodiments, the first deck structure 101 includes a different number of tiers 108, such as less than sixty-four (64) of the tiers 108 (e.g., less than or equal to sixty (60) of the tiers 108, less than or equal to fifty (50) of the tiers 108, less than about forty (40) of the tiers 108, less than or equal to thirty (30) of the tiers 108, less than or equal to twenty (20) of the tiers 108, less than or equal to ten (10) of the tiers 108); or greater than sixty-four (64) of the tiers 108 (e.g., greater than or equal to seventy (70) of the tiers 108, greater than or equal to one hundred (100) of the tiers 108, greater than or equal to about one hundred twenty-eight (128) of the tiers 108) of the insulative structures 104 and the other insulative structures 106.

The first deck structure 101 may be patterned to form stair step structures 112 (which may also be referred to herein as "staircase structures") including a first stair step structure 112a and a second stair step structure 112b. Although FIG. 1A illustrates that the first deck structure 101 includes only two stair step structures 112, the disclosure is not so limited and the microelectronic device structure 100 may include fewer (e.g., one) or more (e.g., three, four, five, six, seven, eight) stair step structures 112. Each of the stair step structures 112 may be referred to herein as a so-called "stadium" since the stair step structures 112 include steps 111 facing (e.g., opposing) one another. In some embodiments, the first stair step structure 112a may be located closer to the source structure 110 (e.g., a common source plate (CSP)) than the second stair step structure 112b. Stated another way, the steps 111 of the first stair step structure 112a may be located closer to the source structure 110 than the steps 111 of the second stair step structure 112b.

Formation of the stair step structures 112 may include, for example, forming a first mask (e.g., a chop mask) over the microelectronic device structure 100 and forming an opening in the first mask at a location corresponding to the location of the second stair step structure 112b and removing portions of the tiers 108 of the insulative structures 104 and the other insulative structures 106 through the opening in the first mask. After removing portions of the tiers 108 of the insulative structures 104 and the other insulative structures 106 through the opening in the first mask, the first mask may be removed.

A second mask (e.g., a photoresist material) may be formed over the microelectronic device structure 100 and openings may be formed therein at locations corresponding to the first stair step structure 112a and the second stair step structure 112b to expose the underlying tier 108 of the insulative structure 104 and the other insulative structure 106. Portions of an uppermost tier 108 of the insulative structure 104 and the other insulative structure 106 exposed through the openings in the second mask may be removed. After removal of the portions of the uppermost tier 108, the second mask may be exposed to a trim chemistry to trim the second mask and increase the lateral dimension (e.g., in the X-direction) of the openings and expose portions of the uppermost tier 108 corresponding to a width (in the X-direction) of a step 111. After trimming the second mask, the exposed underlying tiers 108 of the insulative structure 104 and the other insulative structure 106 may be removed. The process of trimming the second mask and removing the exposed portions of the underlying tiers 108 may be repeated a desired number of times (e.g., until a desired number of steps 111) to form the first stair step structure 112a and the second stair step structure 112b.

The tiers 108 may each include steps 111 defined by edges (e.g., horizontal ends) of the tiers 108. As shown in FIG. 1A, in some embodiments, the steps 111 of the stair step structures 112 are arranged in order, such that steps 111 directly horizontally adjacent one another (e.g., in the x-direction) correspond to tiers 108 of the first deck structure 101 directly vertically adjacent one another. In additional embodiments, the steps 111 of the stair step structures 112 are arranged out of order, such that at least some steps 111 of the stair step structures 112 directly horizontally adjacent one another in the horizontal direction correspond to tiers 108 of first deck structure 101 not directly vertically adjacent one another.

A height H (e.g., in the Z-direction) of the first deck structure 101 may be within a range from about 4.0 micrometers (μm) to about 8.0 such as from about 4.0 to about 5.0 μm, from about 5.0 μm to about 6.0 from about 6.0 μm to about 7.0 or from about 7.0 μm to about 8.0 μm. In some embodiments, the height H is within a range from about 6.0 μm to about 7.0 μm, such as about 6.5 μm. However, the disclosure is not so limited and the height H may be different than those described.

Figure 1B:
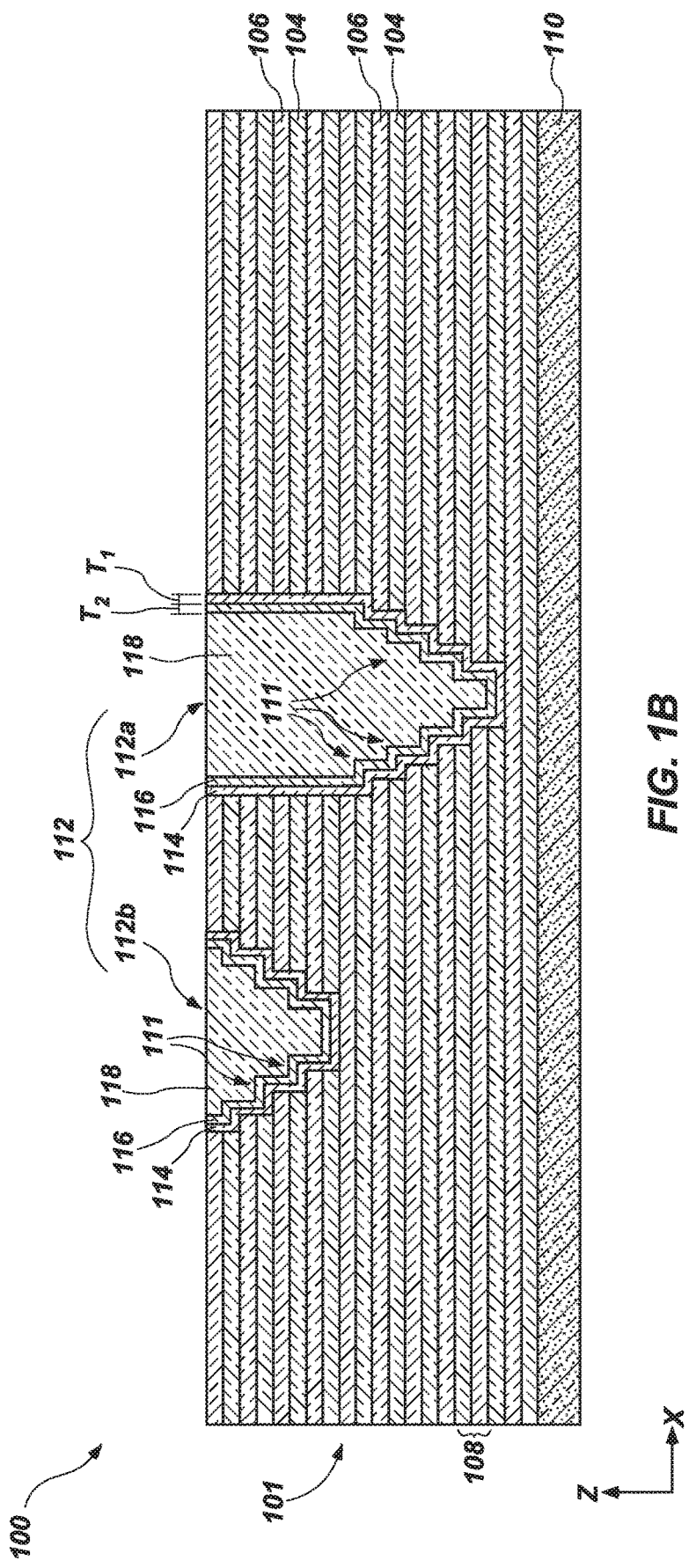

Referring to FIG. 1B, a first liner material 114 may be formed over surfaces of the first stair step structure 112a and the second stair step structure 112b, a second liner material 116 may be formed over the first liner material 114 within horizontal boundaries (e.g., in the X-direction) of the first stair step structure 112a and the second stair step structure 112b, and a dielectric material 118 may be formed over the second liner material 116 and may fill remainders of openings in the first deck structure 101 defined by the first stair step structure 112a and the second stair step structure 112b. In some embodiments, portions of the first liner material 114, the second liner material 116, and the dielectric material 118 formed outside of the boundaries (e.g., horizontal boundaries, vertical boundaries) of the openings defined by the first stair step structure 112a and the second stair step structure 112b may be removed. For example, the microelectronic device structure 100 may be exposed to a chemical mechanical planarization (CMP) process to remove portions of the first liner material 114, the second liner material 116, and the dielectric material 118 outside of the openings defined by the first stair step structure 112a and the second stair step structure 112b.

The first liner material 114 and the second liner material 116 may be conformally formed within the openings defined by the stair step structures 112 (e.g., within the openings defined by the stadiums) and over the steps 111. In some embodiments, the first liner material 114 and the second liner material 116 may extend substantially vertically along sidewalls of the opening defining the second stair step structure 112b and an upper portion of the first deck structure 101.

The first liner material 114 may be formed of and include, for example, one or more of the materials described above with reference to the insulative structures 104. In some embodiments, the first liner material 114 comprises silicon dioxide. In some embodiments, the first liner material 114 comprises the same material composition as the insulative structures 104.

The second liner material 116 may be formed of and include a material exhibiting an etch selectivity with respect to the first liner material 114. By way of non-limiting example, the second liner material 116 may be formed of and include a dielectric material, such as one or more of silicon nitride (e.g., stoichiometric silicon nitride, non-stoichiometric silicon nitride), an oxynitride (e.g., silicon oxynitride), carbon doped silicon nitride, silicon carbon nitride (e.g., SiCN), carbon doped silicon oxynitride, polysilicon, aluminum oxide, hafnium oxide, zirconium oxide, magnesium oxide, calcium oxide, cerium oxide, titanium nitride, tantalum nitride, tungsten nitride, or another material. In some embodiments, the second liner material 116 comprises silicon nitride.

The dielectric material 118 may be formed of and include one or more insulative materials, such as one or more of the materials described above with reference to the insulative structures 104. In some embodiments, the dielectric material 118 comprises the same material composition as the insulative structures 104. In some embodiments, the dielectric material 118 comprises silicon dioxide.

A thickness $T_1$ of the first liner material 114 may be within a range from about 200 Angstroms (Å) to about 100 to about 1,000 Å, such as from about 100 Å to about 200 Å, from about 200 Å to about 400 Å, from about 400 Å to about 600 Å, from about 600 Å to about 800 Å, or from about 800 Å to about 1,000 Å. In some embodiments, the thickness $T_1$ of the first liner material 114 is within a range from about 300 Å to about 500 Å. However, the disclosure is not so limited and the thickness $T_1$ of the first liner material 114 may be different than those described.

A thickness $T_2$ of the second liner material 116 may be within a range from about 200 Å to about 100 to about 1,000 Å, such as from about 100 Å to about 200 Å, from about 200 Å to about 400 Å, from about 400 Å to about 600 Å, from about 600 Å to about 800 Å, or from about 800 Å to about 1,000 Å. In some embodiments, the thickness $T_2$ of the second liner material 116 is within a range from about 300 Å to about 500 Å. However, the disclosure is not so limited and the thickness $T_2$ of the second liner material 116 may be different than those described.

After forming the first liner material 114, the second liner material 116, and the dielectric material 118 within the openings defined by the stair step structures 112, different portions of the microelectronic device structure 100 may be patterned to form pillars of a semiconductive material extending through the first deck structure 101. The pillars may be formed into strings (e.g., vertical strings 307 (FIG. 3)) of memory cells (e.g., memory cells 303 (FIG. 3)), as will be described herein. In other embodiments, the pillars of the semiconductive material may be formed prior to formation of the stair step structures 112.

Figure 1C:
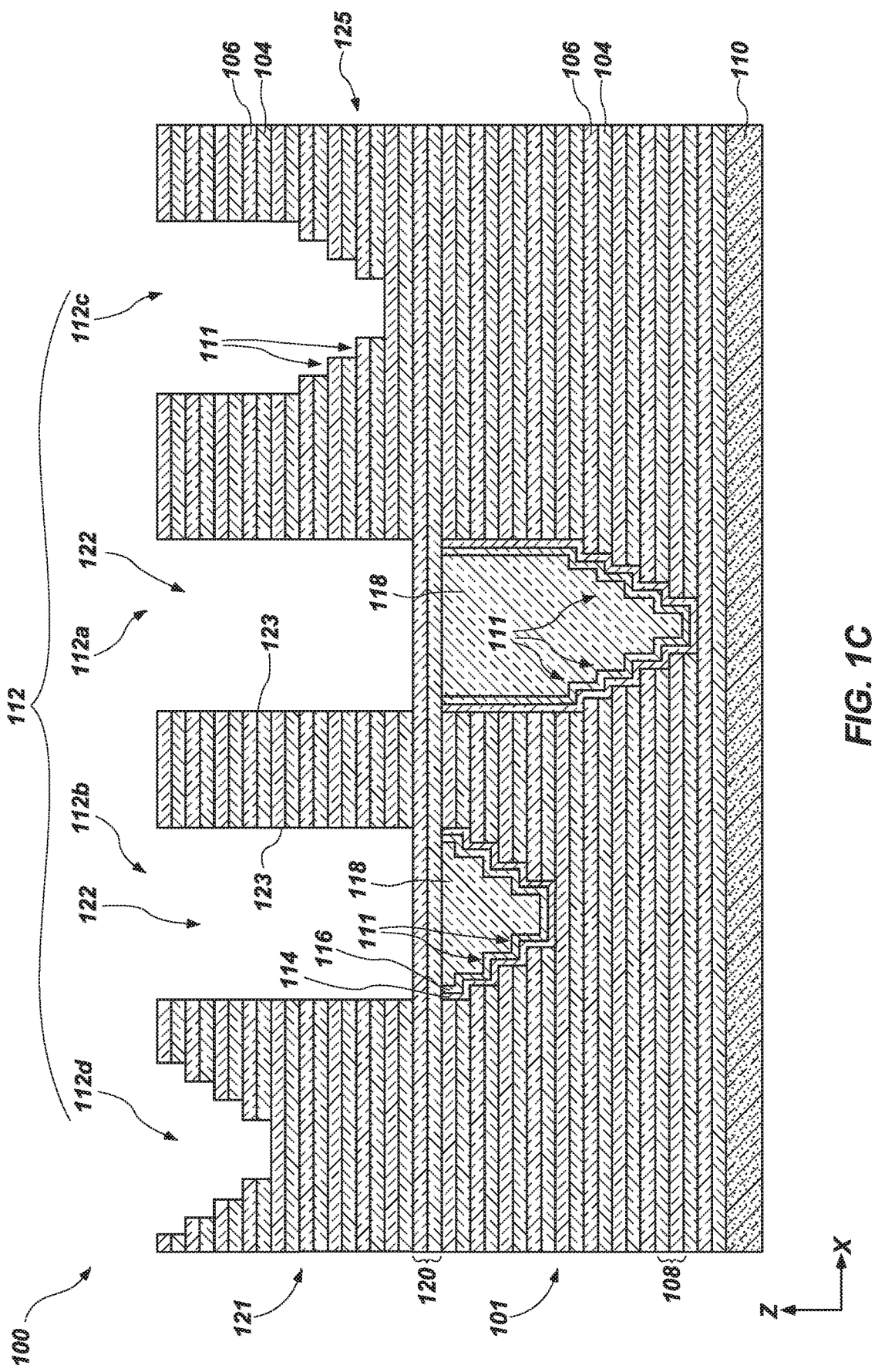

Referring to FIG. 1C, after forming each of the first liner material 114, the second liner material 116, and the dielectric material 118, an interdeck region 120 may be formed over the first deck structure 101 and a second deck structure 121 may be formed over the interdeck region 120 to form a stack structure 125 comprising the first deck structure 101, the interdeck region 120, and the second deck structure 121.

In some embodiments, the interdeck region 120 comprises substantially the same material compositions as the tiers 108 of the insulative structures 104 and the other insulative structures 106. In some embodiments, the interdeck region 120 comprises one (1) tier 108 of an insulative structure 104 and another insulative structure 106.

The second deck structure 121 may be substantially the same as the first deck structure 101. For example, the second deck structure 121 may comprise a vertically alternating (e.g., in Z-direction) sequence of the insulative structures 104 and the other insulative structures 106 arranged in tiers 108.

In some embodiments, a number of tiers 108 of the second deck structure 121 may be the same as the number of tiers 108 of the first deck structure 101. In some embodiments, a height (e.g., in the Z-direction) of the second deck structure 121 may be substantially the same as the height H (FIG. 1A) of the first deck structure 101.

With continued reference to FIG. 1C, after forming the second deck structure 121, additional stair step structures 112 (e.g., a third stair step structure 112c and a fourth stair step structure 112d) may be formed within the second deck structure 121. In addition, openings 122 may be formed over the stair step structures 112 of the first deck structure 101 (e.g., the first stair step structure 112a and the second stair step structure 112b) to expose (e.g., uncover) the interdeck region 120. The openings 122 may be located directly vertically above and within horizontal boundaries of the stair step structures 112 of the first deck structure 101 (e.g., the first stair step structure 112a and the second stair step structure 112b). In some embodiments, the openings 122 may be at least partially defined by vertically extending sidewalls 123.

In some embodiments, the fourth stair step structure 112d may be located farther from the source structure 110 than the third stair step structure 112c. In other words, steps 111 of the fourth stair step structure 112d may be located vertically higher (e.g., in the Z-direction) than the steps 111 of the third stair step structure 112c.

In some embodiments, since the third stair step structure 112c and the fourth stair step structure 112d are formed within the second deck structure 121 located vertically above (e.g., in the Z-direction) the first deck structure 101, the third stair step structure 112c and the fourth stair step structure 112d may be referred to as "upper stair step structures" or "upper stadium structures" and the first stair step structure 112a and the second stair step structure 112b may be referred to as "lower stair step structures" or "lower stadium structures."

Figure 1D:
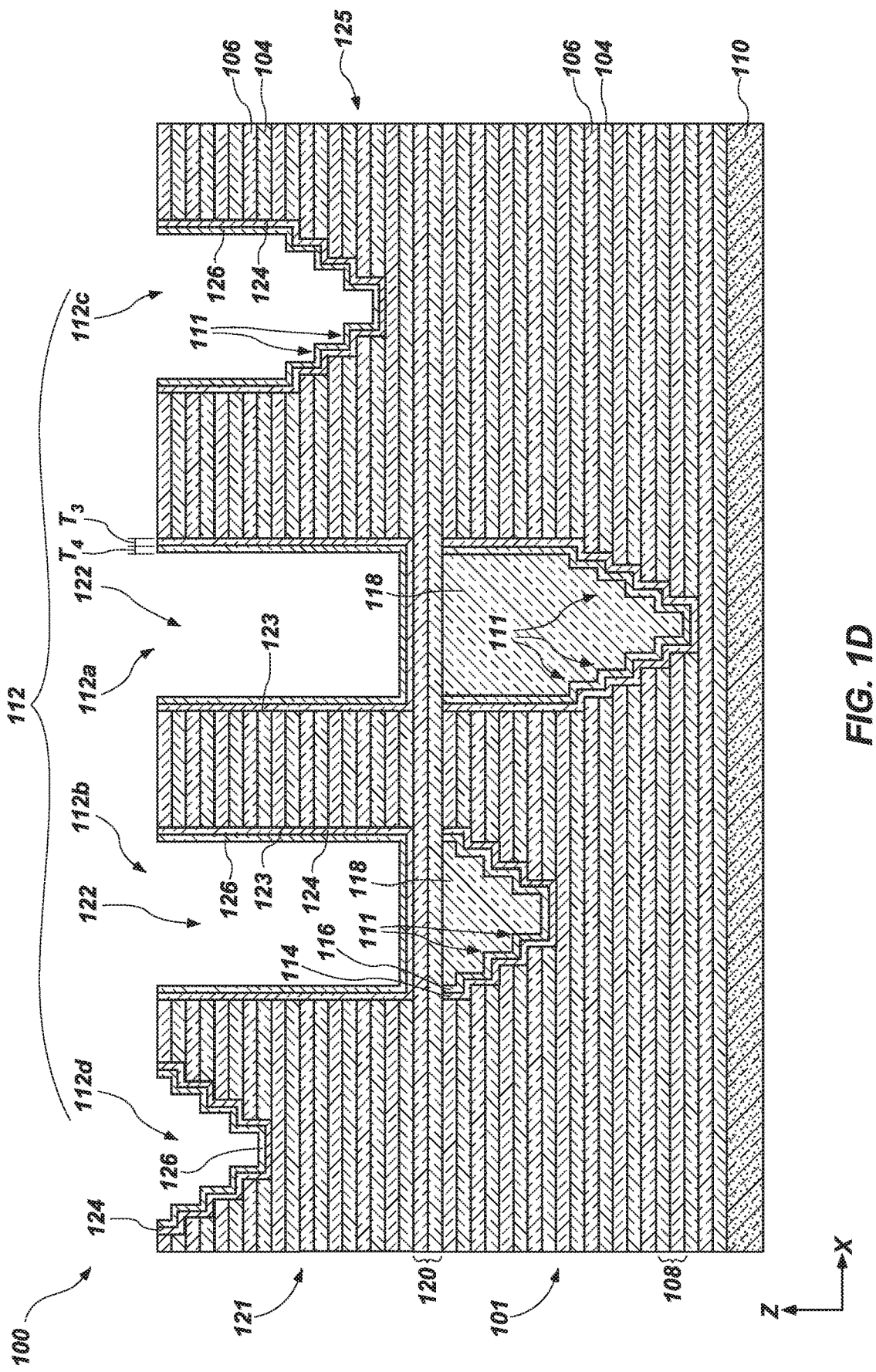

Referring to FIG. 1D, after forming the stair step structure 112, a third liner material 124 may be formed over surfaces defining the openings 122, surfaces of the third stair step structure 112c, and surfaces of the fourth stair step structure 112d and a fourth liner material 126 may be formed over the third liner material 124, the third stair step structure 112c, and the fourth stair step structure 112d. In some embodiments, portions of the third liner material 124 and the fourth liner material 126 formed outside of the boundaries of the stair step structures 112 may be removed, such as by exposing the microelectronic device structure 100 to a CMP process to remove portions of the third liner material 124 and the fourth liner material 126 outside of the boundaries of the stair step structures 112.

The third liner material 124 and the fourth liner material 126 may be conformally formed within additional openings defined by the stair step structures 112 (e.g., within additional openings defined by the additional, upper stadiums) and over the steps 111 thereof. In some embodiments, the third liner material 124 and the fourth liner material 126 may extend substantially vertically along sidewalls of the additional openings defining the third stair step structure 112c and an upper portion of the second deck structure 121. In addition, the third liner material 124 and the fourth liner material 126 may extend conformally along the sidewalls 123 of the second deck structure 121 defining the openings 122.

The third liner material 124 may be formed of and include one or more of the materials described above with reference to the first liner material 114. In some embodiments, the third liner material 124 comprises silicon dioxide. In some embodiments, the third liner material 124 comprises the same material composition as the first liner material 114.

The fourth liner material 126 may be formed of and include one or more of the materials described above with reference to the second liner material 116. In some embodiments, the fourth liner material 126 comprises silicon nitride. In some embodiments, the fourth liner material 126 comprises the same material composition as the second liner material 116.

A thickness $T_3$ of the third liner material 124 may be within a range from about 200 Angstroms (Å) to about 100 to about 1,000 Å, such as from about 100 Å to about 200 Å, from about 200 Å to about 400 Å, from about 400 Å to about 600 Å, from about 600 Å to about 800 Å, or from about 800 Å to about 1,000 Å. In some embodiments, the thickness $T_3$ of the third liner material 124 is within a range from about 300 Å to about 500 Å. However, the disclosure is not so limited and the thickness $T_3$ of the third liner material 124 may be different than those described. In some embodiments, the thickness $T_3$ of the third liner material 124 may be substantially the same as the thickness $T_1$ of the first liner material 114.

A thickness $T_4$ of the fourth liner material 126 may be within a range from about 200 Angstroms (Å) to about 100 to about 1,000 Å, such as from about 100 Å to about 200 Å, from about 200 Å to about 400 Å, from about 400 Å to about 600 Å, from about 600 Å to about 800 Å, or from about 800 Å to about 1,000 Å. In some embodiments, the thickness $T_4$ of the fourth liner material 126 is within a range from about 300 Å to about 500 Å. However, the disclosure is not so limited and the thickness $T_4$ of the fourth liner material 126 may be different than those described. In some embodiments, the thickness $T_4$ of the fourth liner material 126 may be substantially the same as the thickness $T_2$ of the second liner material 116.

Figure 1E:
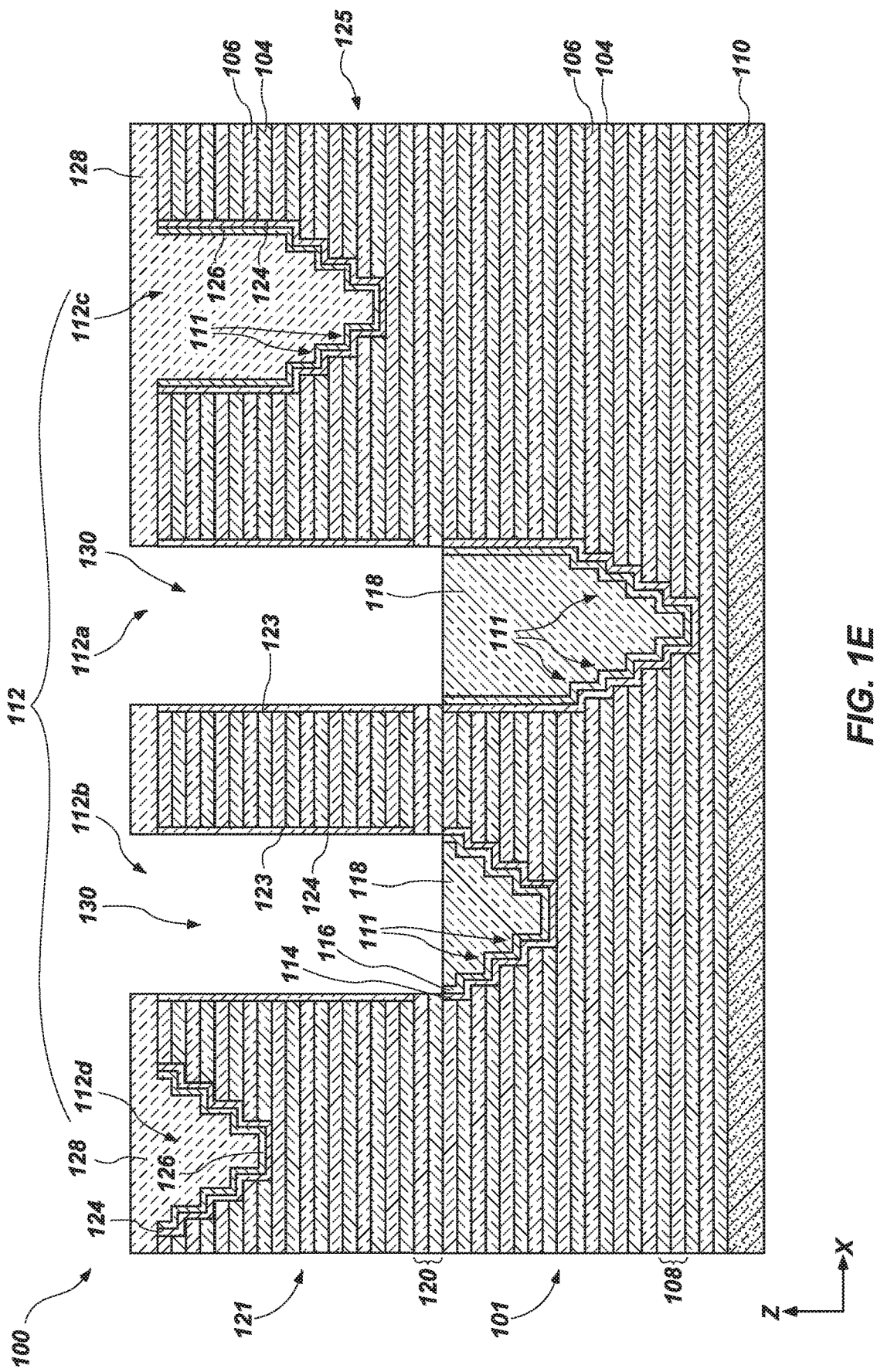

Referring now to FIG. 1E, after forming the third liner material 124 and the fourth liner material 126, a mask material 128 (e.g., a photoresist material) may be formed and patterned over the microelectronic device structure 100. The mask material 128 may be formed over some of the stair step structures 112 (e.g., all of the stair step structures 112).

After forming the mask material 128, the mask material 128 may be removed from over surfaces of some of the stair step structures 112. In some embodiments, portions of the mask material 128 directly vertically overlying (e.g., in the Z-direction) and within the horizontal boundaries of the stair step structures 112 of the first deck structure 101 (e.g., the first stair step structure 112a and the second stair step structure 112b) may be removed to form openings 130 in the mask material 128 and defined at least partially by the second deck structure 121. Surfaces of the fourth liner material 126 (e.g., laterally extending surfaces of the fourth liner material 126) may be exposed through the openings 130. The mask material 128 may vertically overlie and fill the additional openings defined by the stair step structures 112 of the second deck structure 121 (e.g., the third stair step structure 112c and the fourth stair step structure 112d).

In some embodiments, laterally extending portions (e.g., in the X-direction, in the Y-direction (into and out of the page in the view of FIG. 1E)) of the fourth liner material 126 and the third liner material 124 may be removed through the openings 130 while the mask material 128 remains over at least the stair step structures 112 of the second deck structure 121 (e.g., the third stair step structure 112c and the fourth stair step structure 112d). In some embodiments, vertically extending portions (e.g., in the Z-direction) of the fourth liner material 126 may be removed concurrently with removal of the laterally extending portions of the fourth liner material 126 and the third liner material 124. In other words, portions of the fourth liner material 126 on the vertically extending sidewalls 123 may be removed concurrently with removal of the laterally extending portions of the fourth liner material 126. In other embodiments, at least a portion of the fourth liner material 126 may remain on vertically extending sidewalls 123 of the second deck structure 121 partially defining the openings 130. In some embodiments, vertically extending portions of the third liner material 124 on the sidewalls 123 are not substantially removed during removal of the fourth liner material 126.

The portions of the fourth liner material 126 may be removed by exposing the fourth liner material 126 to one or more dry etchants, such as one or more of oxygen ($O_2$), nitrogen ($N_2$), nitrogen trifluoride ($NF_3$), carbon tetrafluoride ($CF_4$), difluoromethane ($CH_2F_2$), fluoroform ($CHF_3$), a mixture of hexafluoroethane and hexafluoropropylene ($C_2F_6/C_3F_6$), a mixture of hexafluoropropylene and hydrogen ($C_3F_6/H_2$), and sulfur hexafluoride ($SF_6$). In other embodiments, the portions of the fourth liner material 126 are removed by exposing the fourth liner material 126 to one or more wet etchants, such as phosphoric acid ($H_3PO_4$). Although FIG. 1E illustrates that the vertically extending portions of the fourth liner material 126 are removed, the disclosure is not so limited. For example and as discussed above, at least a portion of the vertically extending portions of the fourth liner material 126 may remain (e.g., a thickness $T_4$ (FIG. 1D)) of the vertically extending portions of the fourth liner material 126 may be reduced, but a thickness $T_4$ thereof may remain on the sidewalls 123 partially defining the openings 130. In some such embodiments, the thickness $T_4$ of the fourth liner material 126 may decrease with an increasing distance from the source structure 110. Accordingly, in some embodiments, the thickness $T_4$ of the fourth liner material 126 may be variable (e.g., with a distance from the source structure 110).

Portions of the third liner material 124 may be removed by exposing the third liner material 124 to one or more dry etchants, such as one or more of $O_2$, $N_2$, $NF_3$, $CF_4$, and ammonia ($NH_3$) (e.g., $NH_3$ and one of $NF_3$ and $CH_4$). In some embodiments, removal of the third liner material 124 with a dry etchant may facilitate removal of the laterally extending portions of the third liner material 124 while not substantially removing the vertically extending portions of the third liner material 124.

Removal of the laterally extending portions of the fourth liner material 126 and the third liner material 124 may expose portions of the interdeck region 120 vertically overlying (e.g., in the Z-direction) the stair step structures 112 of the first deck structure 101 (e.g., the first stair step structure 112a and the second stair step structure 112b). With continued reference to FIG. 1E, the exposed portions of the interdeck region 120 may be removed to expose the dielectric material 118 and upper portions of the second liner material 116 covering the stair step structures 112 of the first deck structure 101 (e.g., the first stair step structure 112a and the second stair step structure 112b).

In some embodiments, the other insulative structure 106 of the tier 108 of the interdeck region 120 may be removed in substantially the same manner as removal of the fourth liner material 126 and the insulative structure 104 of the tier 108 of the interdeck region 120 may be removed in substantially the same manner as removal of the third liner material 124. By way of non-limiting example, the other insulative structure 106 may be removed by exposing the other insulative structure 106 to one or more of $O_2$, $N_2$, $NF_3$, $CF_4$, $CH_2F_2$, $CHF_3$, $C_2F_6$, $C_3F_6$, $H_2$, and $SF_6$ and the insulative structure 104 may be removed by exposing the insulative structure 104 to one or more of $O_2$, $N_2$, $NF_3$, $CF_4$, and $NH_3$. However, the disclosure is not so limited and the other insulative structure 106 and the insulative structure 104 may be removed by methods other than those described.

Figure 1F:
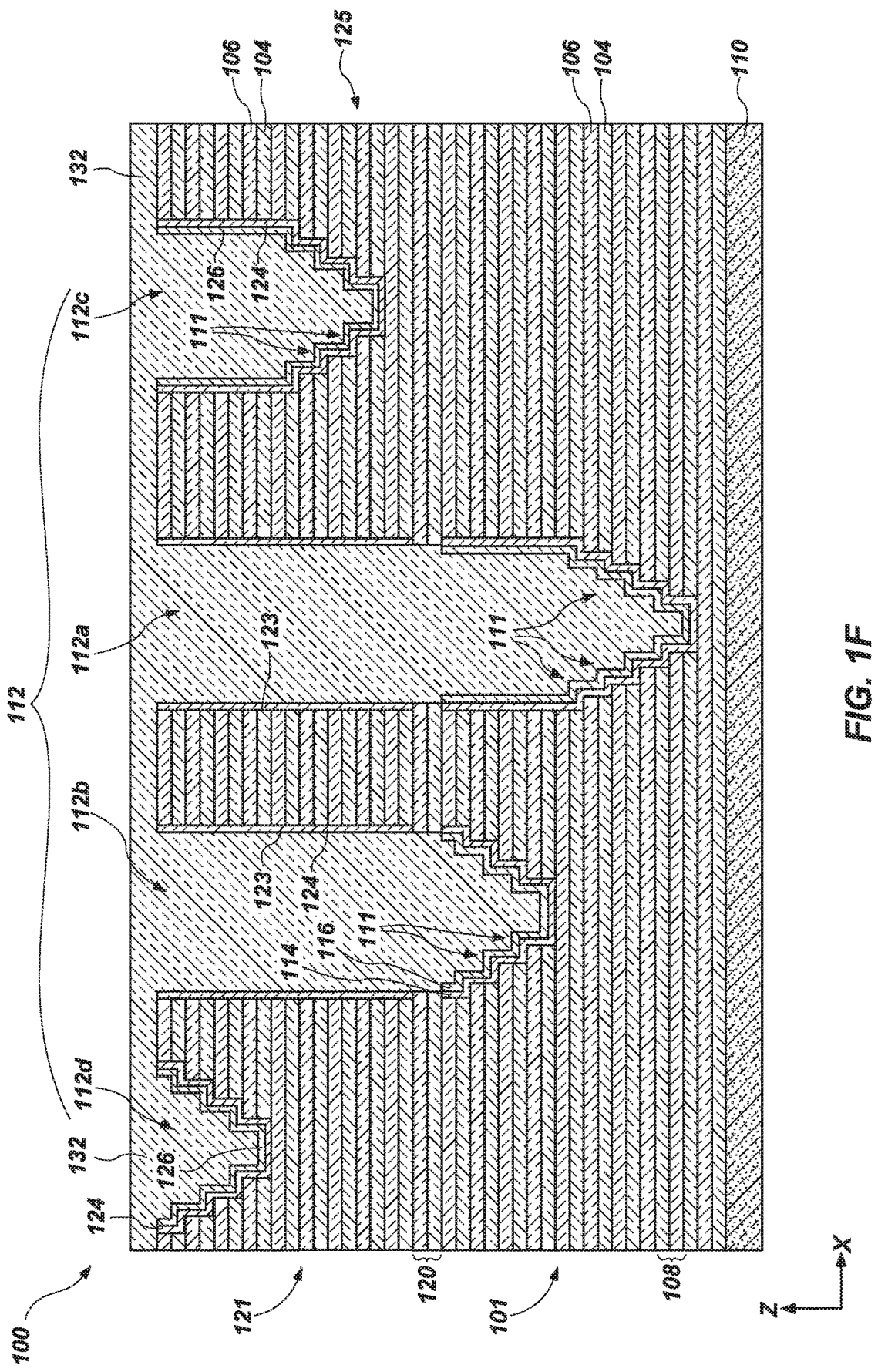

Referring now to FIG. 1F, after uncovering the dielectric material 118, the mask material 128 (FIG. 1E) may be removed from surfaces of the stair step structures 112 of the second deck structure 121 (e.g., the third stair step structure 112c and the fourth stair step structure 112d) and from surfaces of the second deck structure 121 horizontally between the stair step structures 112 of the first deck structure 101 (e.g., from between the openings 130 (FIG. 1E) between the first stair step structure 112a and the second stair step structure). Removal of the mask material 128 may expose (e.g., uncover) portions of the fourth liner material 126 within the additional openings defined by the stair step structures 112 of the second deck structure 121.

After removal of the mask material 128, a dielectric material 132 may be formed over the microelectronic device structure 100, such as over each of the stair step structures 112. In some embodiments, the dielectric material 132 is formed over the fourth liner material 126 of the stair step structures 112 of the second deck structure 121 (e.g., the third stair step structure 112c and the fourth stair step structure 112d) and over the dielectric material 118 (FIG. 1E) of the stair step structures 112 of the first deck structure 101 (e.g., the first stair step structure 112a and the second stair step structure 112b). In some embodiments, the dielectric material 132 directly contacts the third liner material 124 on the sidewalls 123 partially defining the openings 130 (FIG. 1E) over the stair step structures 112 of the first deck structure 101.

The dielectric material 132 may be formed of and include one or more of the materials described above with reference to the dielectric material 118 (FIG. 1B). In some embodiments, the dielectric material 132 comprises silicon dioxide. In some embodiments, the dielectric material 132 comprises the same material composition as the dielectric material 118. Since the dielectric material 132 may include the same material composition as the dielectric material 118 (FIG. 1E), the dielectric material 132 and the dielectric material 118 may be referred to herein collectively as the dielectric material 132. In other words, and with reference to FIG. 1F, the dielectric material 132 may include the dielectric material 118 (FIG. 1E) located within the openings defined by the stair step structures 112 of the first deck structure 101.

After forming the dielectric material 132, the dielectric material 132 may be exposed to a CMP process to planarize the dielectric material 132 and remove portions of the dielectric material 132 located outside of boundaries (e.g., horizontal boundaries, vertical boundaries) of the stair step structures 112.

In some embodiments, after forming the stair step structures 112 of the second deck structure 121, pillars (e.g., cell pillars) formed of and including a semiconductive material may be formed to vertically extend through the second deck structure 121, as described above with reference to the first deck structure 101. The pillars may be located vertically over (e.g., directly vertically over) pillars formed to vertically extend through the first deck structure 101. The pillars may be formed into strings (e.g., vertical strings 307 (FIG. 3)) of memory cells (e.g., memory cells 303 (FIG. 3)), as will be described herein. In other embodiments, the pillars may be formed prior to formation of the stair step structures 112 of the second deck structure 121 (e.g., the third stair step structure 112c and the fourth stair step structure 112d).

Figure 1G:
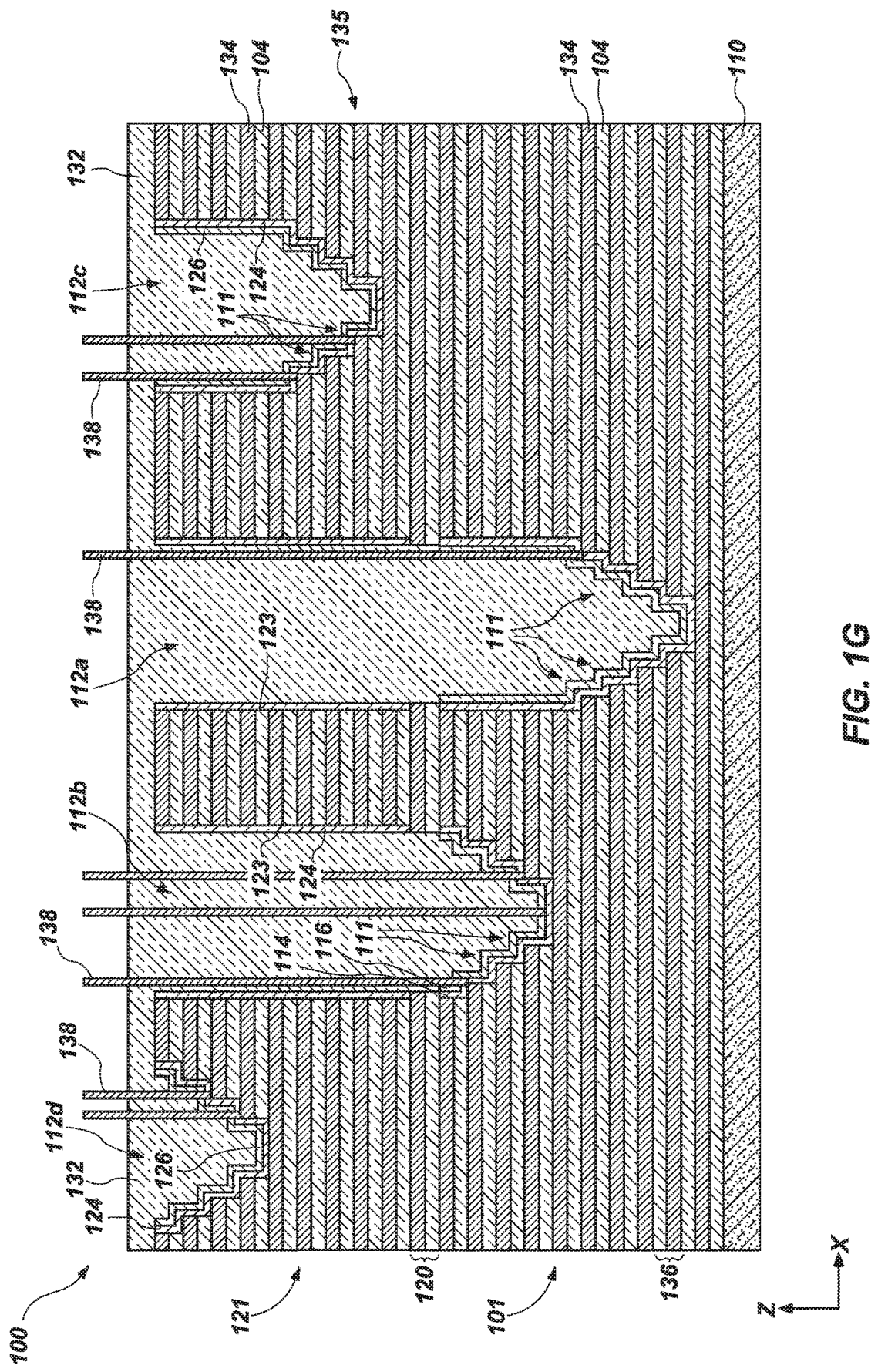

With reference to FIG. 1G, the other insulative structures 106 (FIG. 1F) may be removed and replaced with electrically conductive structures 134 in a so-called "replacement gate" process to form a conductive stack structure 135 including a vertically alternating arrangement of the electrically conductive structures 134 and the insulative structures 104 arranged in tiers 136 (corresponding to the tiers 108 (FIG. 1F)). For example, slots may be formed to vertically extend (e.g., in the Z-direction) through the second deck structure 121, the interdeck region 120, and the first deck structure 101 and then at least some of the other insulative structures 104 of the tiers 108 may be selectively removed through the slots. By way of non-limiting example, the second deck structure 121, the interdeck region 120, and the first deck structure 101 may be exposed to one or more wet etchants including one or more of phosphoric acid, sulfuric acid, ammonium fluoride, or ammonium bifluoride through the slots to selectively remove the other insulative structures 106 (FIG. 1F). Thereafter, electrically conductive material may be deposited within open volumes formed through the extraction of the other insulative structures 106 to form the electrically conductive structures 134 in a so-called "replacement gate" process. A lowermost of the electrically conductive structures 134 (e.g., the conductive structure 134 most proximate the source structure 110) may form a select gate structure, which may comprise a select gate source (SGS) structure. Uppermost electrically conductive structures 134 may form select gate structures, which may comprise select gate drain (SGD) structures.

The electrically conductive structures 134 may comprise local access lines, which may also be referred to as local word lines. The electrically conductive structures 134 may comprise an electrically conductive material, such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the electrically conductive structures 134 comprise tungsten.

In some embodiments, the electrically conductive structures 134 may include one or more liner materials (e.g., a conductive liner material) around the electrically conductive structures 134, such as between the electrically conductive structures 134 and the insulative structures 104. The liner material may comprise, for example, a seed material from which the electrically conductive structures 134 may be formed. The liner material may be formed of and include, for example, a metal (e.g., titanium, tantalum), a metal nitride (e.g., tungsten nitride, titanium nitride, tantalum nitride), aluminum oxide, or another material. In some embodiments, the liner material comprises titanium nitride. In some embodiments, the liner material further includes aluminum oxide. In some embodiments, the electrically conductive structures 134 include aluminum oxide directly adjacent the insulative structures 104, titanium nitride directly adjacent the aluminum oxide, and tungsten directly adjacent the titanium nitride. For clarity and ease of understanding the description, the one or more liner materials are not illustrated in FIG. 1G, but it will be understood that the liner material may be disposed around the electrically conductive structures 134.

With continued reference to FIG. 1G, after forming the electrically conductive structures 134, electrically conductive contact structures 138 (only some of which are illustrated in FIG. 1G, for clarity and ease of understanding embodiments of the disclosure) may be formed through the dielectric material 132 to individually contact the electrically conductive structures 134 of the conductive stack structure 135 at the steps 111 of the stair step structures 112. The electrically conductive contact structures 138 may comprise an electrically conducive material, such as one or more of the electrically conductive materials described above with reference to the electrically conductive structures 134. In some embodiments, the electrically conductive contact structures 138 comprise substantially the same material composition as the electrically conductive structures 134. In some embodiments, the electrically conductive contact structures 138 comprise tungsten.

In some embodiments, the second liner material 116 comprises a so-called etch stop material for the stair step structures 112 of the first deck structure 101 that is not substantially removed during removal of portions of the dielectric material 132 when forming openings in the dielectric material 132 prior to formation of the electrically conductive contact structures 138. Similarly, in some embodiments, the fourth liner material 126 comprises an etch stop material for the stair step structures 112 of the second deck structure 121 that is not substantially removed during removal of portions of the dielectric material when forming openings in the dielectric material 132 prior to formation of the electrically conductive contact structures 138 in the second deck structure 121. After forming the openings in the dielectric material 132, a so-called punch through etch is performed to remove portions of the second liner material 116 and the fourth liner material 126 and expose underlying electrically conductive structures 134 prior to formation of the electrically conductive contact structures 138.

Accordingly, removal of the laterally extending portions of the fourth liner material 126 may facilitate forming the electrically conductive contact structures 138 on the steps 111 of the stair step structures 112 of the first deck structure 101. By way of comparison, during conventional fabrication of microelectronic device structures, the laterally extending portions of the liner material may not be removed and the microelectronic device structure may include two laterally extending portions of a liner material between an upper surface of the second deck structure 121 and the steps of the lower stair step structures (e.g., the stair step structures of the first deck structure). The presence of the laterally extending portion of the second liner material may act as an etch stop material during formation of openings in the dielectric material (e.g., the dielectric material 132) and prevent formation of the electrically conductive contact structures (e.g., electrically conductive contact structures 138) directly on and in electrical communication with the conductive structures (e.g., the electrically conductive structures 134) of the stair step structures of the first deck structure.

Although FIG. 1A through FIG. 1G have been described and illustrated as removing the portions of the interdeck region 120 through the openings 130 (FIG. 1E) in the mask material 128 (FIG. 1E), the disclosure is not so limited. FIG. 2A through FIG. 2D are simplified cross-sectional views illustrating a method of forming a microelectronic device structure, in accordance with additional embodiments of the disclosure.

Figure 2A:
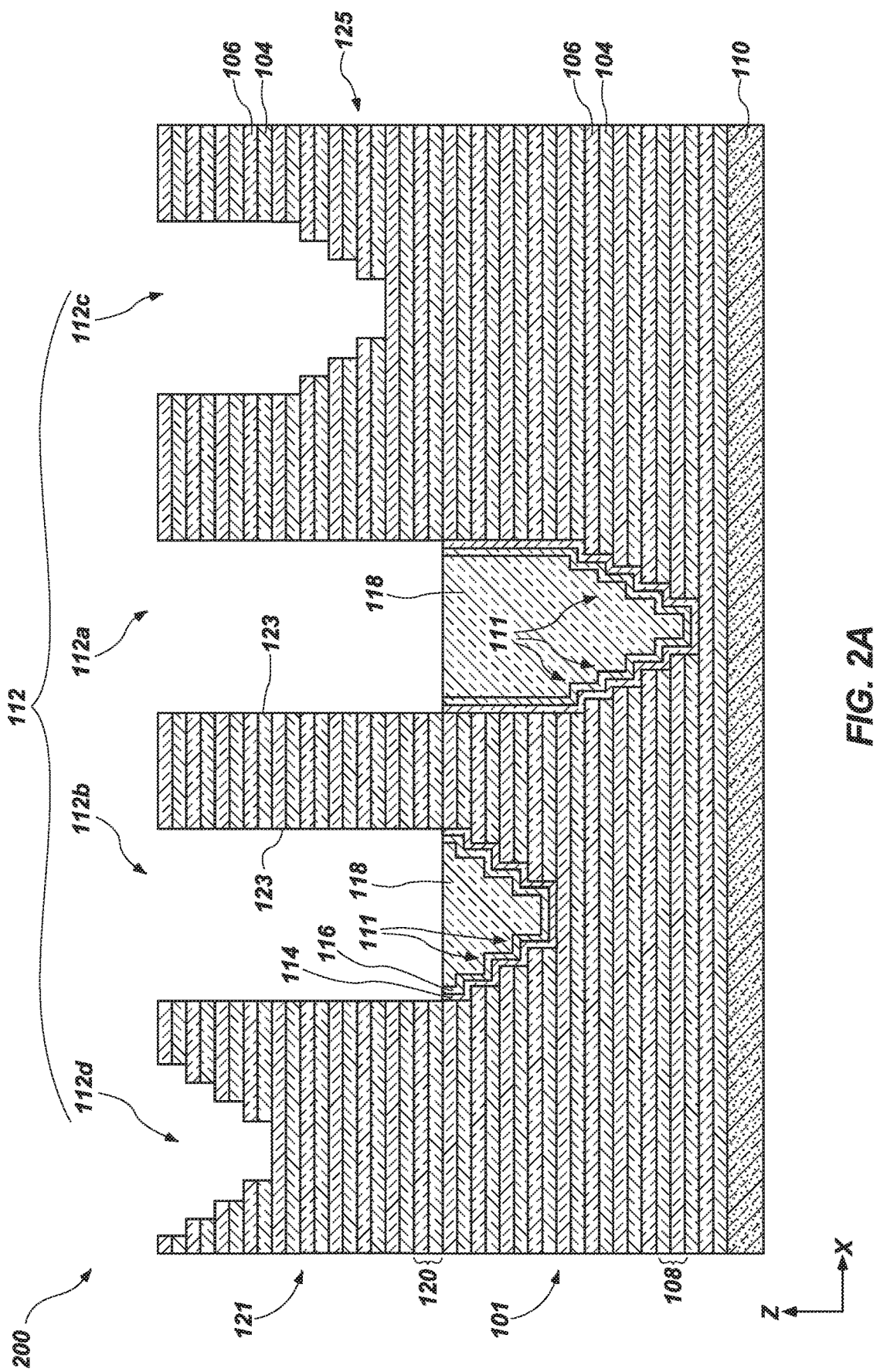
FIG. 2A through FIG. 2D are simplified cross-sectional views illustrating a method of forming a microelectronic device structure, in accordance with other embodiments of the disclosure.

FIG. 2A is a simplified cross-sectional view of a microelectronic device structure 200 that is substantially the same as the microelectronic device structure 100 of FIG. 1C, except that portions of the tier 108 of the interdeck region 120 directly over the stair step structures 112 of the first deck structure 101 (e.g., the first stair step structure 112a and the second stair step structure 112b) have been removed to expose the underlying dielectric material 118.

Figure 2B:
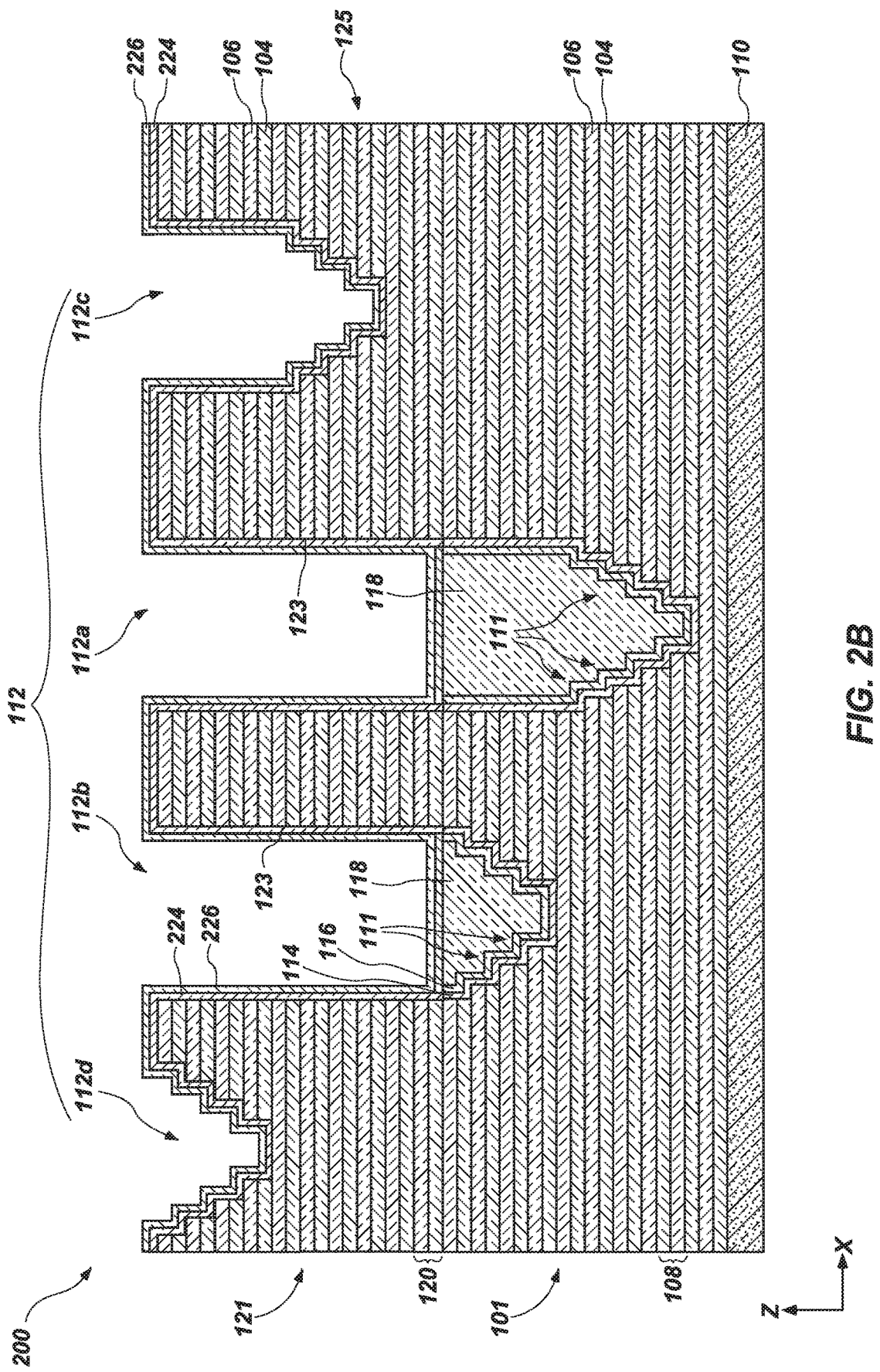

Referring to FIG. 2B, after removing the portions of the tier 108 of the interdeck region 120, a third liner material 224 may be formed over surfaces of the microelectronic device structure 200 and a fourth liner material 226 may be formed over the third liner material 224. In some embodiments, the third liner material 224 may be formed over the steps 111 of the stair step structures 112 of the second deck structure 121 (e.g., the third stair step structure 112c and the fourth stair step structure 112d) and over the dielectric material 118 of the stair step structures 112 of the first deck structure 101 (e.g., the first stair step structure 112a and the second stair step structure 112b).

The third liner material 224 may be formed of and include one or more of the materials described above with reference to the third liner material 124 (FIG. 1D) and the fourth liner material 226 may be formed of and include one or more of the materials described above with reference to the fourth liner material 126 (FIG. 1D).

Figure 2C:
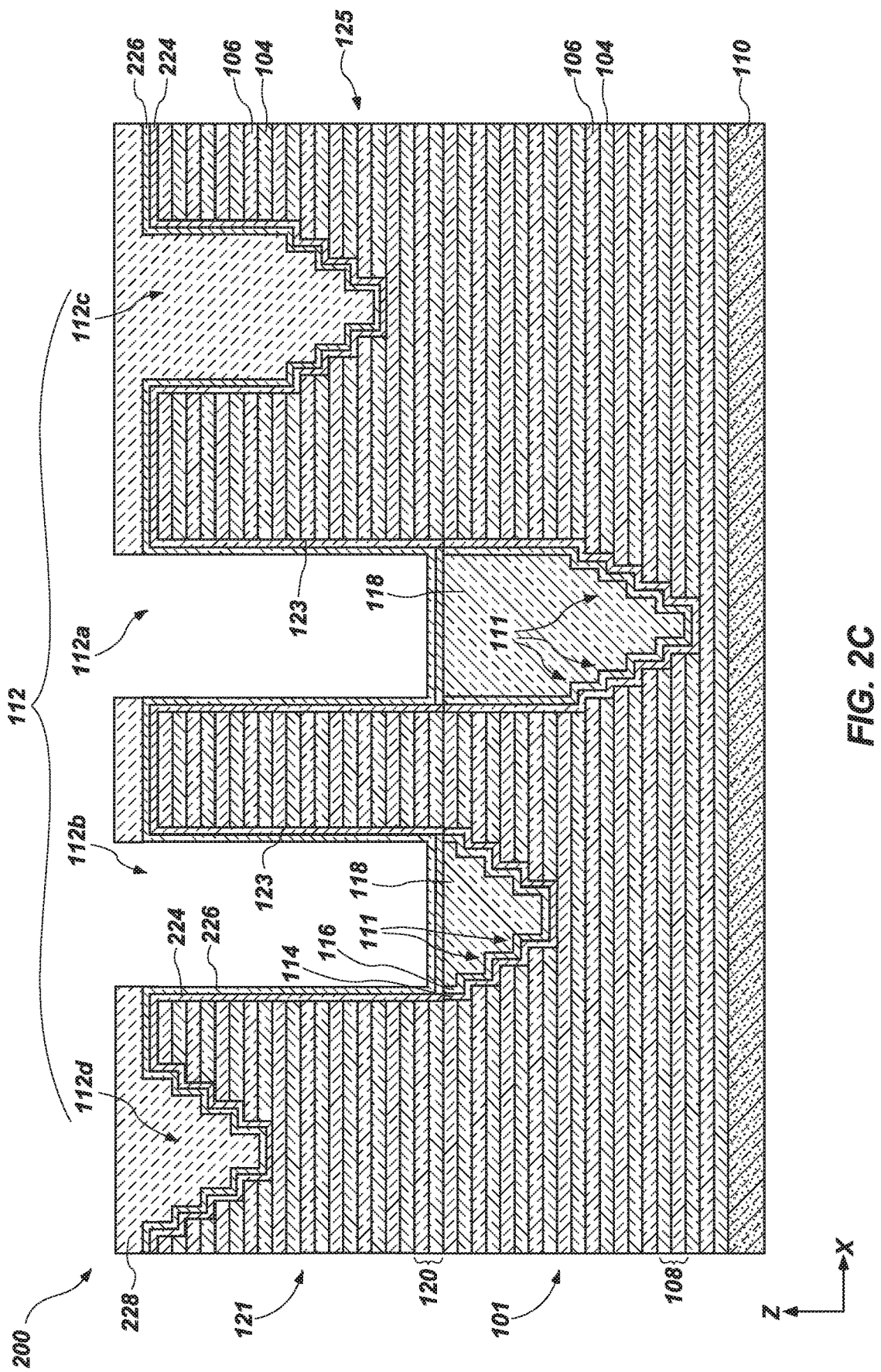

With reference to FIG. 2C, after forming the third liner material 224 and the fourth liner material 226, a mask material 228 (e.g., a photoresist material) may be formed and patterned over surfaces of the microelectronic device structure 200. Openings may be formed in the mask material 228 over the stair step structures 112 of the first deck structure 101. In some embodiments, laterally extending portions (e.g., in the X-direction) of the fourth liner material 226 and the third liner material 224 may be removed from over the stair step structures 112 of the first deck structure 101, as described above with reference to FIG. 1E.

Figure 2D:
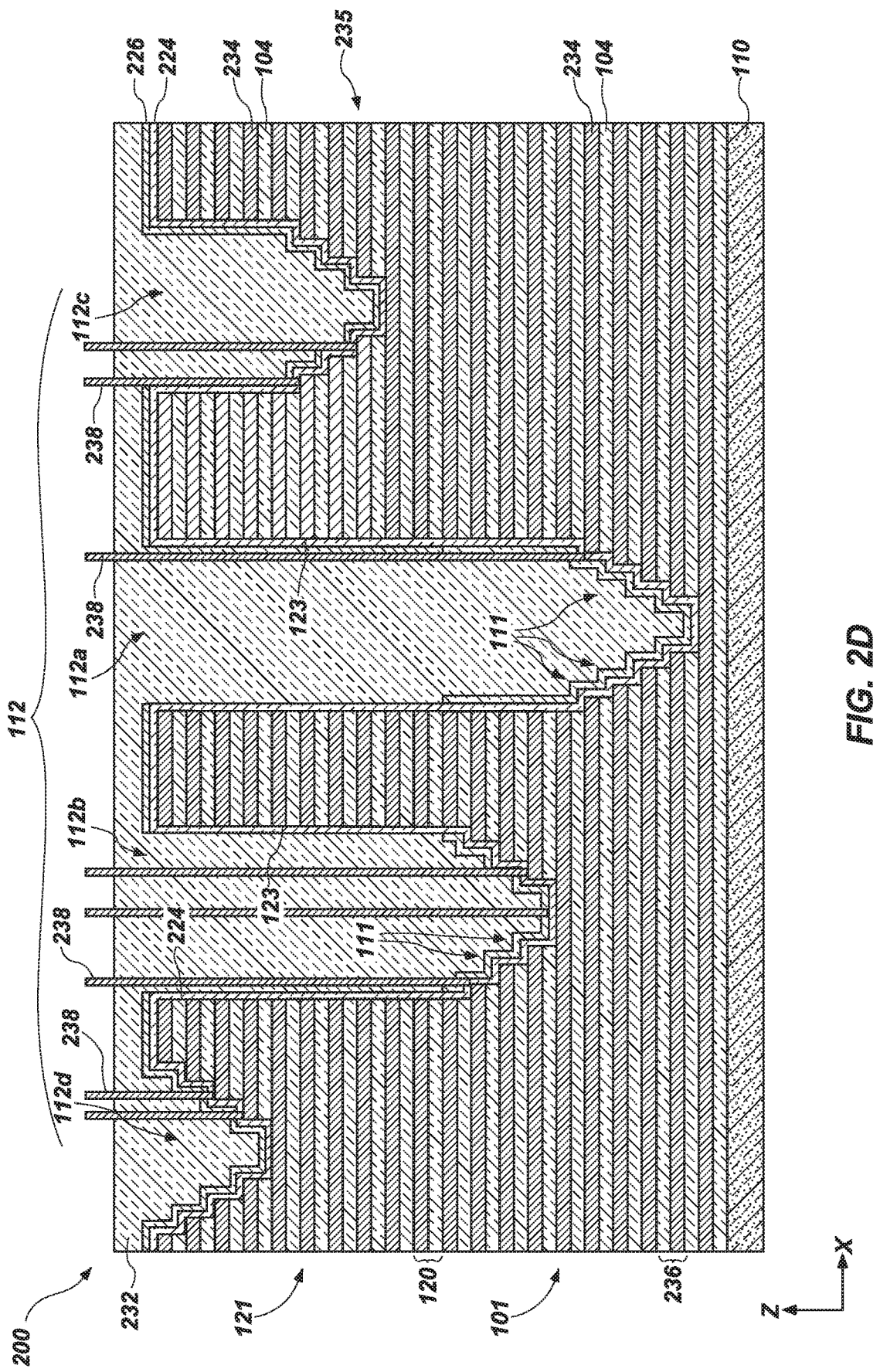

Referring now to FIG. 2D, the mask material 228 (FIG. 2C) may be removed from the surfaces of the microelectronic device structure 200 and a dielectric material 232 may be formed over the microelectronic device structure 200. The dielectric material 232 may be formed of and include one or more of the materials described above with reference to the dielectric material 132 (FIG. 1F).

With continued reference to FIG. 2D, the other insulative structures 106 (FIG. 2C) may be removed and replaced with electrically conductive structures 234 in a so-called "replacement gate" process to form a conductive stack structure 235 including a vertically alternating arrangement of the electrically conductive structures 234 and the insulative structures 104 arranged in tiers 236 (corresponding to the tiers 108 (FIG. 2C)), as described above with reference to formation of the electrically conductive structures 134 (FIG. 1G) and the conductive stack structure 135 (FIG. 1G). For example, slots may be formed to vertically extend (e.g., in the Z-direction) through the second deck structure 121, the interdeck region 120, and the first deck structure 101 and then at least some of the other insulative structures 104 of the tiers 108 may be selectively removed through the slots. The electrically conductive structures 234 may be formed of and include one or more of the materials described above with reference to the electrically conductive structures 134.

After forming the dielectric material 232, electrically conductive contact structures 238 (only some of which are illustrated in FIG. 2D, for clarity and ease of understanding embodiments of the disclosure) may be formed through the dielectric material 232 to individually contact the electrically conductive structures 234 of the conductive stack structure 235 at the steps 111 of the stair step structures 112, as described above with reference to the electrically conductive contact structures 138 (FIG. 1G). The electrically conductive contact structures 238 may be formed of and include one or more of the materials described above with reference to the electrically conductive contact structures 138.

Figure 3:
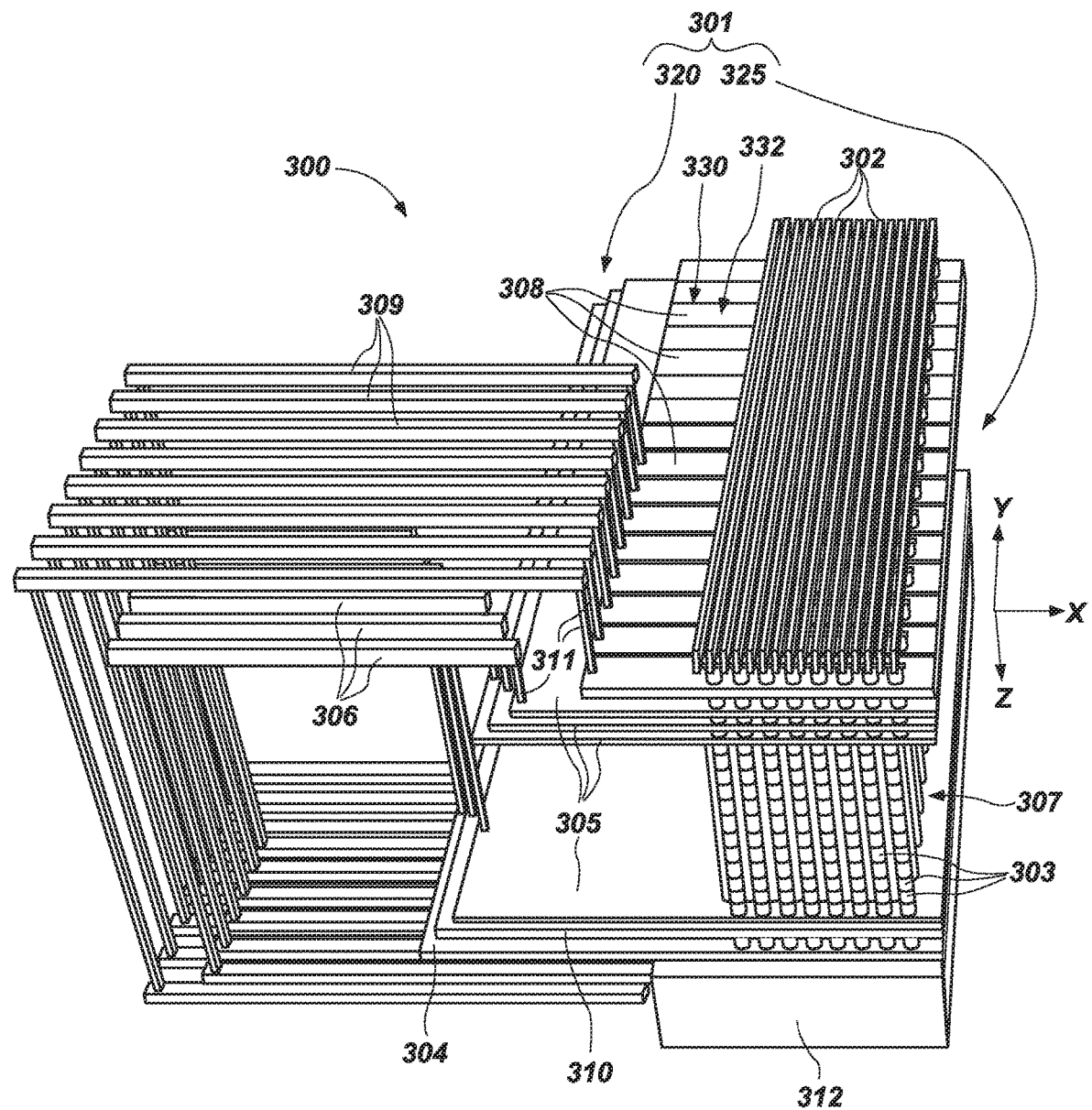
FIG. 3 is a simplified cutaway perspective view of a microelectronic device, according to embodiments of the disclosure.

FIG. 3 illustrates a partial cutaway perspective view of a portion of a microelectronic device 300 (e.g., a memory device, such as a dual deck 3D NAND Flash memory device) including a microelectronic device structure 301. The microelectronic device structure 301 may be substantially similar to the microelectronic device structures 100, 200 previously described with reference to FIG. 1A through FIG. 1G and FIG. 2A through FIG. 2D. As shown in FIG. 3, the microelectronic device structure 301 may include a stack structure 325 (e.g., the conductive stack structure 135 (FIG. 1G), the conductive stack structure 235 (FIG. 2D)) and a stair step structure 320 (e.g., the stair step structures 112 (FIG. 1G, FIG. 2D)) defining contact regions for connecting access lines 306 to conductive tiers 305 (e.g., conductive layers, conductive plates, such as the electrically conductive structures 134 (FIG. 1G) and the electrically conductive structures 234 (FIG. 2D)). The microelectronic device structure 301 may include vertical strings 307 of memory cells 303 that are coupled to each other in series. The vertical strings 307 may extend vertically (e.g., in the Z-direction) and orthogonally to conductive lines and the conductive tiers

305, such as data lines 302, a source tier 304 (e.g., the source structure 110 (FIG. 1G, FIG. 2D)), the conductive tiers 305, the access lines 306, first select gates 308 (e.g., upper select gates, drain select gates (SGDs), such as the electrically conductive structures 134 (FIG. 1G) and the electrically conductive structures 234 (FIG. 2D)), select lines 309, and a second select gate 310 (e.g., a lower select gate, a source select gate (SGS)). The select gates 308 may be horizontally divided (e.g., in the Y-direction) into multiple blocks 332 horizontally separated (e.g., in the Y-direction) from one another by slots 330.

Vertical conductive contacts 311 (e.g., the electrically conductive contact structures 138 (FIG. 1G) and electrically conductive contact structures 238 (FIG. 2D)) may electrically couple components to each other as shown. For example, the select lines 309 may be electrically coupled to the first select gates 308 and the access lines 306 may be electrically coupled to the conductive tiers 305. The microelectronic device 300 may also include a control unit 312 positioned under the memory array, which may include at least one of string driver circuitry, pass gates, circuitry for selecting gates, circuitry for selecting conductive lines (e.g., the data lines 302, the access lines 306), circuitry for amplifying signals, and circuitry for sensing signals. The control unit 312 may be electrically coupled to the data lines 302, the source tier 304, the access lines 306, the first select gates 308, and the second select gates 310, for example. In some embodiments, the control unit 312 includes CMOS (complementary metal-oxide-semiconductor) circuitry. In such embodiments, the control unit 312 may be characterized as having a "CMOS under Array" ("CuA") configuration.

The first select gates 308 may extend horizontally in a first direction (e.g., the X-direction) and may be coupled to respective first groups of vertical strings 307 of memory cells 303 at a first end (e.g., an upper end) of the vertical strings 307. The second select gate 310 may be formed in a substantially planar configuration and may be coupled to the vertical strings 307 at a second, opposite end (e.g., a lower end) of the vertical strings 307 of memory cells 303.

The data lines 302 (e.g., bit lines) may extend horizontally in a second direction (e.g., in the Y-direction) that is at an angle (e.g., perpendicular) to the first direction in which the first select gates 308 extend. The data lines 302 may be coupled to respective second groups of the vertical strings 307 at the first end (e.g., the upper end) of the vertical strings 307. A first group of vertical strings 307 coupled to a respective first select gate 308 may share a particular vertical string 307 with a second group of vertical strings 307 coupled to a respective data line 302. Thus, a particular vertical string 307 may be selected at an intersection of a particular first select gate 308 and a particular data line 302. Accordingly, the first select gates 308 may be used for selecting memory cells 303 of the vertical strings 307 of memory cells 303.

The conductive tiers 305 (e.g., word line plates) may extend in respective horizontal planes. The conductive tiers 305 may be stacked vertically, such that each conductive tier 305 is coupled to all of the vertical strings 307 of memory cells 303, and the vertical strings 307 of the memory cells 303 extend vertically through the stack of conductive tiers 305. The conductive tiers 305 may be coupled to or may form control gates of the memory cells 303 to which the conductive tiers 305 are coupled. Each conductive tier 305 may be coupled to one memory cell 303 of a particular vertical string 307 of memory cells 303.

The first select gates 308 and the second select gates 310 may operate to select a particular vertical string 307 of the memory cells 303 between a particular data line 302 and the source tier 304. Thus, a particular memory cell 303 may be selected and electrically coupled to a data line 302 by operation of (e.g., by selecting) the appropriate first select gate 308, second select gate 310, and conductive tier 305 that are coupled to the particular memory cell 303.

The stair step structure 320 may be configured to provide electrical connection between the access lines 306 and the conductive tiers 305 through the vertical conductive contacts 311. In other words, a particular level of the conductive tiers 305 may be selected via an access line 306 in electrical communication with a respective vertical conductive contact 311 in electrical communication with the particular conductive tier 305.

Thus, in accordance with embodiments of the disclosure a microelectronic device comprises a first deck structure comprising alternating conductive structures and insulating structures arranged in tiers, each of the tiers individually comprising one of the conductive structures and one of the insulating structures, a second deck structure vertically overlying the first deck structure and comprising additional tiers of the conductive structures and insulative structures, a staircase structure within the first deck structure and having steps comprising edges of the tiers, a dielectric material covering the steps of the staircase structure and extending through the first deck structure, and a liner material interposed between the steps of the staircase structure and terminating at an interdeck region between the first deck structure and the second deck structure.

Thus, in accordance with additional embodiments of the disclosure, a microelectronic device comprises a conductive stack structure vertically overlying a source structure and comprising alternating conductive structures and insulative structures arranged in tiers. The conductive stack structure comprises a first deck structure, and a second deck structure vertically overlying the first deck structure. The microelectronic device further comprises strings of memory cells vertically extending through the conductive stack structure, stair step structures within the first deck structure and having steps comprising lateral ends of the tiers, and a liner material on the steps of the stair step structures, a thickness of the liner material decreasing with an increasing distance from the source structure.

Thus in accordance with further embodiments of the disclosure, a method of forming a microelectronic device comprises forming stair step structures in a first deck structure, forming a liner material over steps of the stair step structures, forming an interdeck region vertically overlying the first deck structure and a second deck structure vertically overlying the interdeck region, forming additional stair step structures in and openings in the second deck structure vertically above and within horizontal boundaries of the stair step structures of the first deck structure, forming an additional liner material over additional steps of the additional stair step structures and within the openings in the second deck structure, removing portions of the additional liner material at lower vertical boundaries of the openings, and forming electrically conductive contact structures in contact with the steps of the stair step structures of the first deck structure and the additional steps of the additional stair step structures.

Thus in accordance with yet additional embodiments of the disclosure, a method of forming a microelectronic device comprises forming a first oxide liner material over steps of stadium structures in a first deck structure, forming a first nitride liner material over the first oxide liner material, forming a second deck structure over the first deck structure, forming a second oxide liner material over steps of additional stadium structures in the second deck structure and over surfaces of openings within the second deck structure vertically overlying the stadium structures of the first deck structure, forming a second nitride liner material over the second oxide liner material, and removing laterally extending portions of the second nitride liner material within the openings in the second deck structure.

Figure 4:
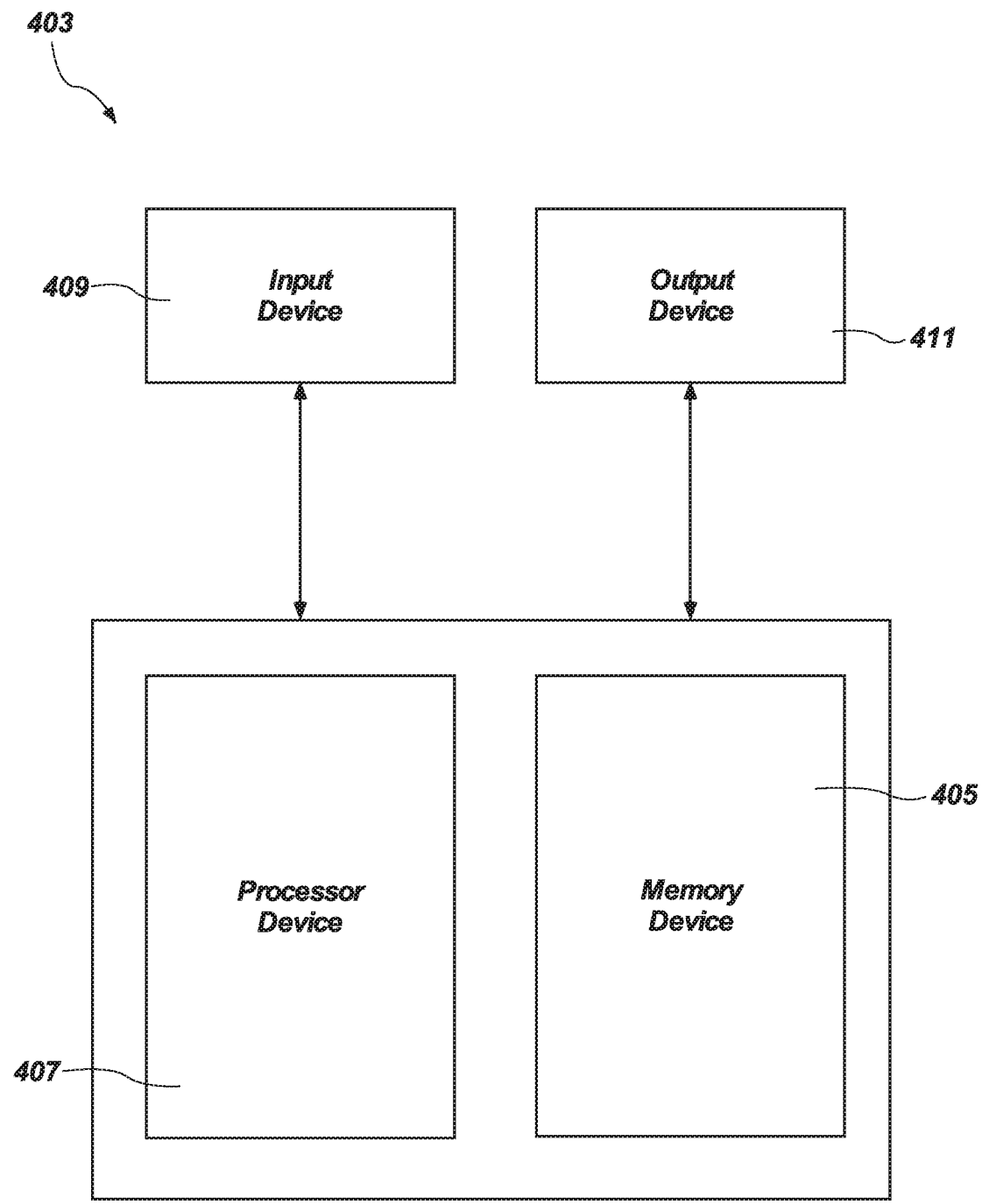
FIG. 4 is a block diagram of an electronic system, in accordance with embodiments of the disclosure.

Microelectronic devices including microelectronic devices (e.g., the microelectronic device 300) and microelectronic device structures (e.g., the microelectronic device structures 100, 200, 301) formed according to embodiments of the disclosure. For example, FIG. 4 is a block diagram of an electronic system 403, in accordance with embodiments of the disclosure. The electronic system 403 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 403 includes at least one memory device 405. The memory device 405 may include, for example, an embodiment of a microelectronic device structure previously described herein (e.g., the microelectronic device structure 100, 200, 301) or a microelectronic device (e.g., the microelectronic device 300) previously described with reference to FIG. 1A through FIG. 1G, FIG. 2A through FIG. 2D, and FIG. 3.

The electronic system 403 may further include at least one electronic signal processor device 407 (often referred to as a "microprocessor"). The electronic signal processor device 407 may, optionally, include an embodiment of a microelectronic device or a microelectronic device structure previously described herein (e.g., one or more of the microelectronic device 300 or the microelectronic device structure 100, 200, 301 previously described with reference to FIG. 1A through FIG. 1G, FIG. 2A through FIG. 2D, and FIG. 3). The electronic system 403 may further include one or more input devices 409 for inputting information into the electronic system 403 by a user, such as, for example, a mouse or other pointing device, a keyboard, a touchpad, a button, or a control panel. The electronic system 403 may further include one or more output devices 411 for outputting information (e.g., visual or audio output) to a user such as, for example, a monitor, a display, a printer, an audio output jack, a speaker, etc. In some embodiments, the input device 409 and the output device 411 may comprise a single touchscreen device that can be used both to input information to the electronic system 403 and to output visual information to a user. The input device 409 and the output device 411 may communicate electrically with one or more of the memory device 405 and the electronic signal processor device 407.

Figure 5:
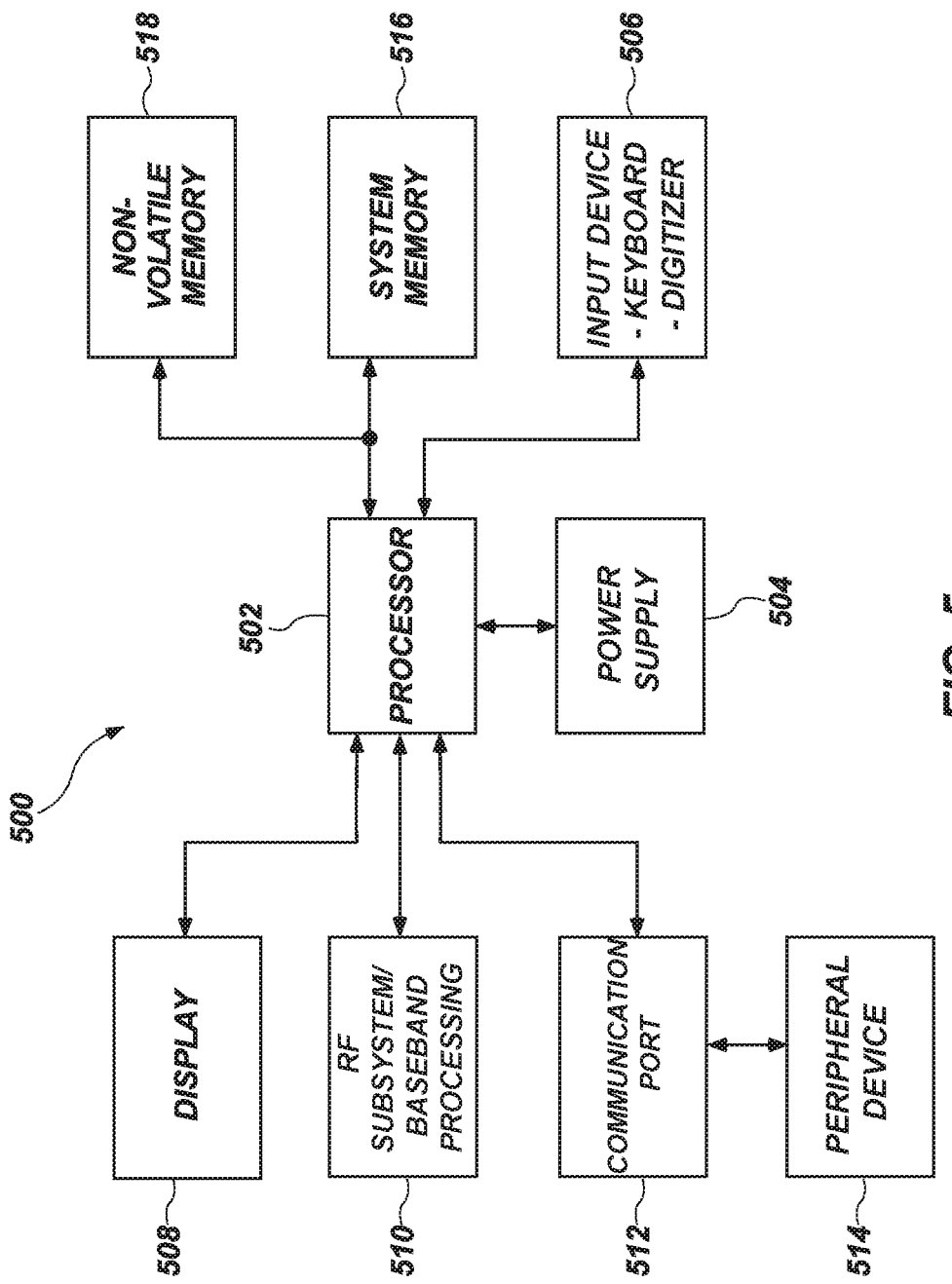
FIG. 5 is a block diagram of a processor-based system, in accordance with embodiments of the disclosure.

With reference to FIG. 5, depicted is a processor-based system 500. The processor-based system 500 may include various microelectronic devices and microelectronic device structures (e.g., microelectronic devices and microelectronic device structures including one or more of the microelectronic device 300 or the microelectronic device structure 100, 200, 301) manufactured in accordance with embodiments of the present disclosure. The processor-based system 500 may be any of a variety of types such as a computer, pager, cellular phone, personal organizer, control circuit, or other electronic device. The processor-based system 500 may include one or more processors 502, such as a microprocessor, to control the processing of system functions and requests in the processor-based system 500. The processor 502 and other subcomponents of the processor-based system 500 may include microelectronic devices and microelectronic device structures (e.g., microelectronic devices and microelectronic device structures including one or more of the microelectronic device 300 or the microelectronic device structure 100, 200, 301) manufactured in accordance with embodiments of the present disclosure.

The processor-based system 500 may include a power supply 504 in operable communication with the processor 502. For example, if the processor-based system 500 is a portable system, the power supply 504 may include one or more of a fuel cell, a power scavenging device, permanent batteries, replaceable batteries, and rechargeable batteries. The power supply 504 may also include an AC adapter; therefore, the processor-based system 500 may be plugged into a wall outlet, for example. The power supply 504 may also include a DC adapter such that the processor-based system 500 may be plugged into a vehicle cigarette lighter or a vehicle power port, for example.

Various other devices may be coupled to the processor 502 depending on the functions that the processor-based system 500 performs. For example, a user interface 506 may be coupled to the processor 502. The user interface 506 may include input devices such as buttons, switches, a keyboard, a light pen, a mouse, a digitizer and stylus, a touch screen, a voice recognition system, a microphone, or a combination thereof. A display 508 may also be coupled to the processor 502. The display 508 may include an LCD display, an SED display, a CRT display, a DLP display, a plasma display, an OLED display, an LED display, a three-dimensional projection, an audio display, or a combination thereof. Furthermore, an RF sub-system/baseband processor 510 may also be coupled to the processor 502. The RF sub-system/baseband processor 510 may include an antenna that is coupled to an RF receiver and to an RF transmitter (not shown). A communication port 512, or more than one communication port 512, may also be coupled to the processor 502. The communication port 512 may be adapted to be coupled to one or more peripheral devices 514, such as a modem, a printer, a computer, a scanner, or a camera, or to a network, such as a local area network, remote area network, intranet, or the Internet, for example.

The processor 502 may control the processor-based system 500 by implementing software programs stored in the memory. The software programs may include an operating system, database software, drafting software, word processing software, media editing software, or media playing software, for example. The memory is operably coupled to the processor 502 to store and facilitate execution of various programs. For example, the processor 502 may be coupled to system memory 516, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 516 may include volatile memory, non-volatile memory, or a combination thereof. The system memory 516 is typically large so that it can store dynamically loaded applications and data. In some embodiments, the system memory 516 may include semiconductor devices, such as the microelectronic devices and microelectronic device structures (e.g., the microelectronic device 300 and the microelectronic device structure 100, 200, 301) described above, or a combination thereof.

The processor 502 may also be coupled to non-volatile memory 518, which is not to suggest that system memory 516 is necessarily volatile. The non-volatile memory 518 may include one or more of STT-MRAM, MRAM, read-only memory (ROM) such as an EPROM, resistive read-only memory (RROM), and flash memory to be used in conjunction with the system memory 516. The size of the non-volatile memory 518 is typically selected to be just large enough to store any necessary operating system, application programs, and fixed data. Additionally, the non-volatile memory 518 may include a high-capacity memory such as disk drive memory, such as a hybrid-drive including resistive memory or other types of non-volatile solid-state memory, for example. The non-volatile memory 518 may include microelectronic devices, such as the microelectronic devices and microelectronic device structures (e.g., the microelectronic device 300 and the microelectronic device structure 100, 200, 301) described above, or a combination thereof.

Thus, in accordance with embodiments of the disclosure an electronic system comprises an input device, an output device, a processor device operably coupled to the input device and the output device, and a memory device operably coupled to the processor device and comprising at least one microelectronic device. The at least one microelectronic device comprises first stair step structures within a first deck structure comprising tiers of alternating conductive structures and insulative structures, second stair step structures within a second deck structure vertically overlying the first deck structure, and a nitride liner material adjacent the steps of the first stair step structures, a region between the first deck structure and the second deck structure free of the nitride liner material.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising: a first deck structure comprising alternating conductive structures and insulative structures arranged in tiers, each of the tiers individually comprising one of the conductive structures and one of the insulative structures;
    a second deck structure vertically overlying the first deck structure and comprising additional tiers of the conductive structures and insulative structures;
    a staircase structure within the first deck structure and having steps comprising edges of the tiers;
    a dielectric material covering the steps of the staircase structure and extending through the first deck structure;
    a liner material interposed between the steps of the staircase structure and the dielectric material and terminating at an interdeck region between the first deck structure and the second deck structure and vertically below the additional tiers of the conductive structures and the insulative structures;
    an additional liner material vertically spaced from the liner material by the interdeck region and horizontally aligned with the liner material and directly contacting horizontal edges of the additional tiers of the conductive structures and insulative structures;
    further comprising a further additional liner material between the liner material and the steps of the staircase structure, the liner material between the further additional liner material and the dielectric material; and
    wherein the further additional liner material extends from the steps of the staircase structure to an upper portion of the second deck structure.

2. The microelectronic device of claim 1, wherein the liner material comprises one or more of silicon nitride, an oxynitride, carbon doped silicon nitride, silicon carbon nitride, carbon doped silicon oxynitride, polysilicon, aluminum oxide, hafnium oxide, zirconium oxide, magnesium oxide, calcium oxide, cerium oxide, titanium nitride, tantalum nitride, and tungsten nitride.

3. The microelectronic device of claim 1, wherein the liner material comprises silicon nitride.

4. The microelectronic device of claim 1, wherein the further additional liner material comprises silicon dioxide.

5. The microelectronic device of claim 1, wherein the further additional liner material terminates at the interdeck region.

6. The microelectronic device of claim 1, further comprising electrically conductive contact structures extending through and contacting each of the dielectric material, the liner material, and an additional liner material between the liner material and the steps of the staircase structure, the electrically conductive contact structures individually contacting one of the steps of the staircase structure.

7. The microelectronic device of claim 1, further comprising an additional staircase structure within the second deck structure, the additional staircase structure horizontally spaced from the staircase structure by a region of the first deck structure and the second deck structure not including steps, additional steps of the additional staircase structure vertically offset from the steps of the staircase structure.

8. The microelectronic device of claim 7, further comprising a further additional liner material comprising a nitride material covering the additional steps of the additional staircase structure.

9. The microelectronic device of claim 1, wherein the liner material extends substantially vertically from one of the steps of the staircase structure to the interdeck region.

10. A microelectronic device, comprising: a conductive stack structure vertically overlying a source structure and comprising alternating conductive structures and insulative structures arranged in tiers, the conductive stack structure comprising:
    a first deck structure; and
    a second deck structure vertically overlying the first deck structure;
    strings of memory cells vertically extending through the conductive stack structure;
    stair step structures within the first deck structure and having steps comprising lateral ends of the tiers of the first deck structure;
    additional stair step structures within the second deck structure and having additional steps comprising lateral ends of the tiers of the second deck structure;
    a liner material conformally overlying the additional steps of the additional stair step structures, a thickness of the liner material decreasing with an increasing distance from the source structure;

a dielectric material vertically overlying and directly contacting the liner material and vertically overlying the stair step structures;

wherein the liner material comprises silicon nitride; and wherein the liner material extends over the steps of the stair step structures and vertically extending sidewalls of the second deck structure defining openings in the second deck structure, the vertically extending sidewalls defined by horizontal edges of the alternating conductive structures and insulative structures.

11. The microelectronic device of claim 10, wherein the liner material terminates at an interdeck region between the first deck structure and the second deck structure.

12. The microelectronic device of claim 10, further comprising additional stair step structures within the second deck structure.

13. An electronic system, comprising:
an input device;
an output device;
a processor device operably coupled to the input device and the output device; and
a memory device operably coupled to the processor device and comprising at least one microelectronic device, the at least one microelectronic device comprising: first stair step structures within a first deck structure comprising tiers of alternating conductive structures and insulative structures;
second stair step structures within a second deck structure vertically overlying the first deck structure;
a nitride liner material contacting the steps of the first stair step structures, a region between the first deck structure and the second deck structure comprising additional tiers of the alternating conductive structures and the insulative structures not contacting the nitride liner material;
a dielectric material overlying and directly contacting the nitride liner material, horizontal edges of the additional tiers of the alternating conductive structures and the insulative structures contacting the dielectric material;
wherein the dielectric material contacts the liner material and the additional liner material on vertical sidewalls of the additional tiers of the conductive structures and the insulative structures; and
further comprising a further additional liner material between the liner material and the steps of the staircase structure, wherein:
the further additional liner material conformally overlies the steps of the staircase structure;
the liner material conformally overlies the further additional liner material; and
the dielectric material overlies the liner material.

14. The electronic system of claim 13, further comprising a dielectric material extending through the second deck structure and overlying the nitride liner material.

15. The electronic system of claim 14, wherein the nitride liner material is between the tiers of the second deck structure and the dielectric material, the nitride liner material having a greater thickness adjacent the steps of the second deck structure than along vertically extending sidewalls of openings within the second deck structure.

16. The electronic system of claim 13, wherein the nitride liner material has a thickness within a range from about 200 Angstroms (Å) to about 1,000 Å.

* * * * *

UNITED STATES PATENT AND TRADEMARK OFFICE
CERTIFICATE OF CORRECTION

| | | |
|---|---|---|
| PATENT NO. | : 11,830,815 B2 | Page 1 of 1 |
| APPLICATION NO. | : 17/006600 | |
| DATED | : November 28, 2023 | |
| INVENTOR(S) | : Harsh Narendrakumar Jain | |

It is certified that error appears in the above-identified patent and that said Letters Patent is hereby corrected as shown below:

In the Specification

| | | |
|---|---|---|
| Column 4, | Line 28, | change "palladium (Pa)," to --palladium (Pd),-- |
| Column 7, | Line 50, | change "about 8.0 such" to --about 8.0 µm, such-- |
| Column 7, | Line 51, | change "about 6.0 from" to --about 6.0 µm, from-- |
| Column 7, | Line 52, | change "about 7.0 or" to --about 7.0 µm, or-- |
| Column 14, | Line 50, | change "electrically conducive material, such" to --electrically conductive material, such-- |

In the Claims

| | | | |
|---|---|---|---|
| Claim 13, | Column 24, | Line 13, | change "of the staircase structure, wherein:" to --of the first stair step structures, wherein:-- |
| Claim 13, | Column 24, | Line 16, | change "of the staircase structure;" to --of the first stair step structures;-- |

Signed and Sealed this
Twenty-third Day of July, 2024

Katherine Kelly Vidal
*Director of the United States Patent and Trademark Office*